United States Patent
Lazarus

(10) Patent No.: US 11,792,557 B1
(45) Date of Patent: Oct. 17, 2023

(54) SOUND CAPTURE SYSTEM FOR USE WITHIN SOUND-GENERATING DEVICES

(71) Applicant: Latin Pulse Music Inc., Dayton, NV (US)

(72) Inventor: Michael P. Lazarus, Scotts Valley, CA (US)

(73) Assignee: LATIN PULSE MUSIC INC., Dayton, NV (US)

( * ) Notice: Subject to any disclaimer, the term of this patent is extended or adjusted under 35 U.S.C. 154(b) by 0 days.

(21) Appl. No.: 17/751,400

(22) Filed: May 23, 2022

(51) Int. Cl.
  H04R 1/20 (2006.01)
  H04R 1/08 (2006.01)
  H04R 1/28 (2006.01)
  H04R 1/46 (2006.01)

(52) U.S. Cl.
  CPC .......... H04R 1/083 (2013.01); H04R 1/2876 (2013.01); H04R 1/2892 (2013.01); H04R 1/46 (2013.01)

(58) Field of Classification Search
  CPC .................................. H04R 1/083; H04R 1/46
  USPC ........................................................ 381/345
  See application file for complete search history.

(56) References Cited

U.S. PATENT DOCUMENTS

| | | | | |
|---|---|---|---|---|
| 4,151,777 A | * | 5/1979 | Sugiyama | G10C 3/02 84/723 |
| 10,374,562 B1 | * | 8/2019 | Cloud | H03F 3/181 |
| 10,469,939 B1 | * | 11/2019 | Tikander | H04R 1/1008 |
| 10,614,783 B2 | * | 4/2020 | Kilpatrick | G10D 13/02 |
| 10,721,552 B1 | | 7/2020 | Cloud et al. | |
| 2001/0043704 A1 | * | 11/2001 | Schwartz | H03G 3/32 381/98 |
| 2005/0022655 A1 | * | 2/2005 | Wise | G10H 3/26 84/743 |
| 2006/0272490 A1 | * | 12/2006 | May | G10H 3/146 84/743 |
| 2007/0121979 A1 | * | 5/2007 | Zhu | H04R 25/505 381/315 |
| 2007/0295189 A1 | | 12/2007 | Kelly | |
| 2013/0208923 A1 | | 8/2013 | Suvanto | |
| 2014/0051483 A1 | * | 2/2014 | Schoerkmaier | G10K 11/17853 455/570 |
| 2017/0330543 A1 | * | 11/2017 | Liu | G06V 10/147 |
| 2018/0102121 A1 | * | 4/2018 | Shaw | G10H 3/182 |
| 2020/0053452 A1 | | 2/2020 | Fallon | |

(Continued)

OTHER PUBLICATIONS

Björgvin Benediktsson, "Get a Thundering Tom Sound in 3 Easy Steps", 2017, Audio Issues (Year: 2017).*

(Continued)

*Primary Examiner* — Katherine A Faley
(74) *Attorney, Agent, or Firm* — CUENOT, FORSYTHE & KIM, LLC

(57) ABSTRACT

A sound capture system can include a sound capture device configured for placement within a sound-generating device. The sound capture system can include a suspension system configured to suspend the sound capture device within the sound-generating device. The suspension system acoustically decouples the sound capture device from the sound-generating device. The sound capture device includes a plurality of transducers configured to generate a plurality of audio signals concurrently from sound generated by the sound-generating device. In another aspect, the sound capture system includes a signal processing circuit.

21 Claims, 29 Drawing Sheets

(56) References Cited

U.S. PATENT DOCUMENTS

2020/0322717 A1  10/2020  Negishi et al.

OTHER PUBLICATIONS

Fox, A., "Mic History: Who Invented Each Type Of Microphone And When?" [online] Copyright @ 2022 Fox Media Tech Inc., mynewmicrophone.com [retrieved Jan. 12, 2023], retrieved from the Internet: <https://mynewmicrophone.com/mic-history-who-invented-each-type-of-microphone-and-when/#1877:-Invention-Of-The-Moving-Coil-Microphone>, 18 pg.
Clark, K., "A Historical Look at Electro-Voice," [online] Pro Audio Encyclopedia, Jan. 21, 2015, retrieved from the Internet: <http://proaudioencyclopedia.com/a-historical-look-at-electro-voice/>, 13 pg.
WIPO Appln. No. PCT/US23/022251, International Search Report and Written Opinion, dated Jul. 28, 2023, 9 pg.

\* cited by examiner mode (0,1)          mode (0,1)

mode (1,1)          mode (1,1)

mode (2,1)          mode (2,1)

2800

Provide a sound capture device configured for placement within a sound-generating device
2802

Provide a suspension system configured to suspend the sound capture device within the sound-generating device
2804

Generate a first differential signal from a first transducer disposed in a musical instrument
2902

Generate a second differential signal from a second transducer disposed in the musical instrument
2904

Generate a first composite signal from the first differential signal
2906

Generate a second composite signal from the second differential signal
2908

Signal processing the first composite signal and the second composite signal using signal processing circuitry to generate an audio output signal by, at least in part, taking a difference between the first composite signal and the second composite signal.
2910

FIG. 29

SOUND CAPTURE SYSTEM FOR USE WITHIN SOUND-GENERATING DEVICES

TECHNICAL FIELD

This disclosure relates to a sound capture system adapted for use within a sound-generating device.

BACKGROUND

The sounds created by playing musical instruments may be captured electronically using transducers. A transducer such as a microphone may be used to capture the sound generated by a musical instrument for any of a variety of different purposes ranging from amplifying the captured sounds in the case of a live performance to creating a sound recording. The traditional approach for capturing the sound generated by a musical instrument has been to place a microphone external to the musical instrument and near the musical instrument.

Certain classes of percussion instruments have a membrane that is stretched over or across some portion of the musical instrument. A player strikes the membrane using one or more different techniques to generate sound. One or more transducers are typically placed near the membrane to capture the sound generated by the musical instrument when the player strikes the membrane.

In some cases, a transducer may be placed inside of certain musical instruments such as a bass or "kick" drum of a drum set. Despite the placement of the transducer relative to the musical instrument, the transducer is typically held by a fixed or rigid mounting stand.

SUMMARY

In one or more example implementations, a system includes a sound capture device configured for placement within a sound-generating device. The system can include a suspension system configured to suspend the sound capture device within the sound-generating device. The suspension system is capable of acoustically decoupling the sound capture device from the sound-generating device. The sound capture device can include a plurality of transducers configured to generate a plurality of audio signals concurrently from sound generated by the sound-generating device.

In one aspect, the sound-generating device is a musical instrument. For example, the musical instrument can be a percussion instrument. In one or more examples, the musical instrument has a stretched membrane. For example, the musical instrument may be a drum. In one or more examples, the musical instrument is a conga.

In another aspect, the sound capture device and the suspension system are configured to retrofit within the sound-generating device.

In another aspect, the suspension system suspends the sound capture device within the sound-generating device so as to avoid physical contact of the sound capture device with an interior surface of the sound-generating device.

In another aspect, the sound capture device is encompassed by radio frequency shielding.

In another aspect, the sound capture device includes at least one of an inner dust protective layer or an outer dust protective layer.

In another aspect, the suspension system includes an adjustable mounting system configured for retrofitting to existing hardware of the sound-generating device, wherein the hardware of the sound-generating device is located within the sound-generating device.

In another aspect, the system can include a diffusor positioned below the sound capture device within the sound-generating device.

In another aspect, the diffusor can include a hollow body.

In another aspect, a plurality of prongs extend out from the hollow body. The plurality of prongs are configured to contact an inner surface of the sound-generating device to prevent the hollow body from contacting the inner surface of the sound-generating device.

In another aspect, the sound capture device can include a first transducer configured to generate a first audio signal of the plurality of audio signals. The sound capture device can include a second transducer configured to generate a second audio signal of the plurality of audio signals.

In another aspect, the first transducer and the second transducer are radio-frequency noise-canceling transducers.

In another aspect, the first transducer is a first humbucking capsule and the second transducer is a second humbucking capsule.

In another aspect, the first transducer and the second transducer are included in a transducer assembly that is suspended within the sound capture device.

In another aspect, the first transducer and the second transducer are aligned along an axis forming an angle with a plane of a stretched membrane of the sound-generating device that is greater than 0° and less than 90°. For example, the angle may be approximately 45 degrees.

In another aspect, the system can include a signal processing circuit configured to receive the plurality of audio signals and generate an output audio signal from the plurality of audio signals.

In another aspect, the signal processing circuit includes a processor programmed to initiate executable operations.

In another aspect, the signal processing circuit includes a power supply configured provide power to one or more active components of the signal processing circuit. The power supply is configured to derive the power from a phantom power source coupled thereto.

In another aspect, the signal processing circuit includes a preamplifier circuit configured to amplify a first audio signal of the plurality of audio signals generated by a first transducer of the plurality of transducers and amplify a second audio signal of the plurality of audio signals generated by a second transducer of the plurality of transducers.

In another aspect, the signal processing circuit can include a phase shift and attenuator circuit coupled to an output of the preamplifier circuit. The phase shift and attenuator circuit is configured to generate a phase-shifted version of the first audio signal by phase shifting a first frequency range of the first audio signal by approximately 180 degrees.

In another aspect, the phase shift and attenuator circuit is configured to modify a level of at least one of the first audio signal or the second audio signal so that the first audio signal, as phase-shifted, and the second audio signal have substantially same levels.

In another aspect, the signal processing circuit can include a difference amplifier circuit configured to sum the first audio signal and the phase-shifted version of the second audio signal.

In another aspect, the signal processing circuit can include one or more filter circuits coupled to an output of the difference amplifier circuit. The one or more filter circuits are configured to attenuate frequencies in a second frequency range and increase frequencies in one or more other frequency ranges.

In another aspect, the one or more filter circuits can include a high-pass filter circuit configured to attenuate frequencies at or below approximately 60 Hz.

In another aspect, the one or more filter circuits can include a high-frequency boost filter circuit configured to increase frequencies between approximately 3 kHz and approximately 10 kHz.

In another aspect, the one or more filter circuits can include a mid-frequency boost filter circuit configured to increase frequencies approximately within the first frequency range of the phase shift circuit.

In another aspect, the signal processing circuit can include an output stage including a transformer configured to generate the output signal.

In one or more example implementations, a musical instrument can include a shell having a stretched membrane. The musical instrument can include a sound capture device configured for placement within the shell. The musical instrument can include a suspension system configured to suspend the sound capture device within shell. The suspension system is capable of acoustically decoupling the sound capture device from the musical instrument. The sound capture device can include a plurality of transducers configured to generate a plurality of audio signals concurrently from sound generated by the musical instrument.

In one aspect, the suspension system is adapted to retrofit the musical instrument with the sound capture device.

In another aspect, the musical instrument can include a diffusor positioned below the sound capture device within the shell.

In another aspect, the diffusor can include a hollow body.

In another aspect, the diffusor can include a plurality of prongs extending out from the hollow body. The plurality of prongs are configured to contact an inner surface of the sound-generating device to prevent the hollow body from contacting the inner surface of the sound-generating device.

In another aspect, the musical instrument can include a signal processing circuit configured to receive the plurality of audio signals and generate an output audio signal from the plurality of audio signals.

In another aspect, the signal processing circuit includes a processor programmed to initiate executable operations.

In one or more example implementations, a method can include providing a sound capture device configured for placement within a sound-generating device. The method can include providing a suspension system configured to suspend the sound capture device within the sound-generating device. The suspension system is capable of acoustically decoupling the sound capture device from the sound-generating device. The sound capture device can include a plurality of transducers configured to generate a plurality of audio signals concurrently from sound generated by the sound-generating device.

In another aspect, the method can include providing a signal processing circuit configured to receive the plurality of audio signals and generate an output audio signal from the plurality of audio signals.

In another aspect, the signal processing circuit includes a processor programmed to initiate executable operations.

In another aspect, the method can include providing a diffusor within the sound-generating device.

In another aspect, the method can include installing the sound capture device within a musical instrument.

In another aspect, the installing retrofits the sound capture device to the musical instrument.

In another aspect, the method can include installing the sound capture device and the signal processing circuit within the musical instrument.

In one or more example implementations, a method can include generating a first differential signal from a first transducer disposed in a musical instrument. The method can include generating a second differential signal from a second transducer disposed in the musical instrument. The method can include generating a first composite signal from the first differential signal. The method can include generating a second composite signal from the second differential signal. The method can include signal processing the first composite signal and the second composite signal using signal processing circuitry to generate an audio output signal by, at least in part, taking a difference between the first composite signal and the second composite signal.

In another aspect, the signal processing can include filtering a difference signal generated by the taking a difference between the first composite signal and the second composite signal using one or more filter circuits.

In another aspect, the method can include providing power to one or more active components of a signal processing circuit configured to perform the signal processing, wherein the power is derived from a phantom power source.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 28 illustrates an example method for a sound capture system in accordance with the inventive arrangements described herein.

FIG. 29 illustrates an example method illustrating certain operative features of the inventive arrangements described herein.

DETAILED DESCRIPTION

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to a sound capture system adapted for use within a sound-generating device. In one aspect, the sound-generating device is a musical instrument. In accordance with the inventive arrangements described within this disclosure, example implementations of sound capture systems are provided that utilize a sound capture device. The sound capture device may be disposed within the sound-generating device. In one or more example implementations, the sound capture device is suspended within the sound-generating device. The sound capture device is capable of translating sound waves generated by the sound-generating device into audio signals that may be output to other systems for amplification, mixing, recording, signal processing, or other purposes.

In one or more example implementations, the sound capture system includes a signal processing circuit. The signal processing circuit is capable of receiving audio signals generated by the sound capture device. The signal processing circuit is capable of performing various signal processing operations on the audio signals from the sound capture device. The signal processing circuit generates, from the audio signals, a processed audio signal. The processed audio signal generated by the signal processing circuit, also referred to herein as the "output signal," may be output or provided to one or more other systems or devices.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figure 1:
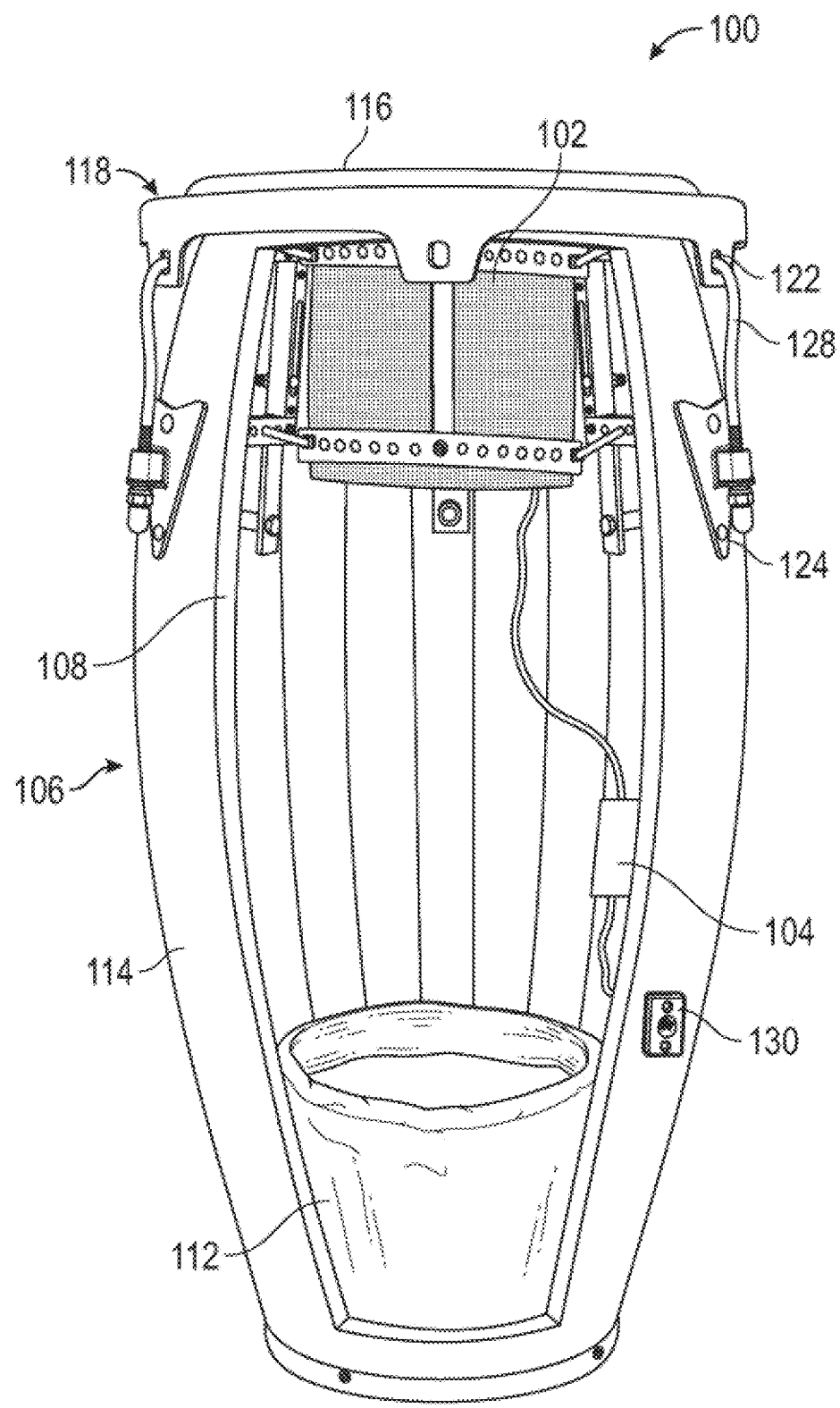
FIG. 1 illustrates certain operative features of an example sound capture system.

FIG. 1 illustrates an example implementation of a sound capture system 100. In the example of FIG. 1, sound capture system 100 includes a sound capture device 102 and a signal processing circuit 104. In the example, the sound-generating device is a musical instrument 106. Musical instrument 106 is shown having a portion cutaway (e.g., cutaway 108). Cutaway 108 is for purposes of illustration only to better depict the position of sound capture device 102 and signal processing circuit 104 within musical instrument 106. In normal or regular operation, musical instrument 106 will not have or include any cutaways. Through cutaway 108, sound capture device 102 is visible as being disposed within musical instrument 106. Sound capture device 102 includes one or more transducers that capture sound generated by musical instrument 106. Through cutaway 108, a diffusor 112 is visible. Diffusor 112 is optionally included as part of sound capture system 100 within musical instrument 106.

In one or more example implementations, musical instrument 106 is a percussion instrument. In the example, musical instrument 106 is a class of percussion instrument having a membrane stretched across some portion of the musical instrument. In an example implementation, musical instrument 106 is a conga. Other examples of different types of musical instruments with which the inventive arrangements may be used include, but are not limited to, kick drums, snare drums, tom-toms, floor toms, timbales, caixa, repique, surdo, taiko, thammattama, timpani, urumi, zabumba, bongos, congas, batá, barriles (bomba), cajón, dholak, djembe, doumbek, kpanlogo, mridangam, sabar, and/or tabla. It should be appreciated that the inventive arrangements described within this disclosure may be used within any of a variety of different musical instruments including different types of percussion instruments such as percussion instruments having stretched membranes. For example, sound capture system 100 may be used with any of a variety of different types of drum. In other arrangements, sound capture system 100 may be used with other varieties of sound-generating devices.

In the example of FIG. 1, musical instrument 106 includes a shell 114 having a drumhead 116. Drumhead 116 is an example of a stretched membrane. Drumhead 116 is held in place by a a rim 118 having a plurality of tab portions 122. In the example, tuning lugs 128 may have one end that is hooked onto an aperture in the tab portion 122 and another end that is threaded to engage a tuning bracket 124. A fastener such as a nut may prevent each tuning lug 128 from disengaging from tuning bracket 124.

In the example, tuning brackets 124 are coupled to shell 114 by way of fasteners such as bolts that extend through shell 114 beyond the inner surface of shell 114. In the example of FIG. 1, two bolts are used to couple tuning brackets 124 to shell 114. The bolts may be threaded. Musical instrument 106 may have a number of tuning brackets 124 that depends on the size, e.g., circumference, of shell 114 and/or drumhead 116. For purposes of illustration, musical instrument 106 may have 5 or 6 tuning brackets where shells and/or drumheads with larger circumferences typically have a larger number of tuning brackets than those with smaller circumferences.

Sound capture device 102 is communicatively linked to signal processing circuit 104. In one aspect, signal processing circuit 104 may be mounted to the inner surface of shell 114. In other example implementations, signal processing circuit 104 may be mounted to an outer surface of shell 114. In still other example implementations, signal processing circuit 104 need not be mounted or affixed to shell 114 or to musical instrument 106 at all.

In the example of FIG. 1, signal processing circuit 104 has an output coupled to an audio connector 130. In an example implementation, audio connector 130 is a standard XLR connector. Use of an XLR connector allows electrical power to be supplied to signal processing circuit 104 by way of "phantom power." Phantom power refers to the +48 volts of DC power that may be provided through XLR cables by certain types of musical equipment (e.g., mixing consoles, preamplifiers, audio interfaces, etc.) to other audio equipment such as certain types of microphones. In this example, signal processing circuit 104 is powered by phantom power. Though audio connector 130 is described as an XLR connector, it should be appreciated that other types of connectors may be used and that use of an XLR connector is not intended to be a limitation of the inventive arrangements. Still, use of an XLR connector provides wide-ranging compatibility and connectivity of sound capture system 100 with other music and/or sound equipment.

In the example, audio connector 130 may be mounted in shell 114. In other examples, audio connector 130 may be included as part of signal processing circuit 104, e.g., disposed in or built into the housing of signal processing circuit 104. In another example, audio connector 130 may be located at the end of a cable that extends out from signal processing circuit 104 through the bottom or open portion of musical instrument 106. The particular manner in which signal processing circuit 104 and/or audio connector 130 are coupled to sound capture device 102 and/or to the musical instrument 106 is not intended to be limiting.

In the example, sound capture device 102 is suspended within musical instrument 106. Sound capture device 102 may be suspended within musical instrument 106 using a suspension system. Suspension of sound capture device 102 acoustically decouples sound capture device 102 from musical instrument 106. As defined within this disclosure, the term "acoustically decouple" means that sound capture device 102 is not in physical contact with musical instrument 106. In the example, sound capture device 102 couples to musical instrument 106 via a non-rigid structure such as the suspension system. Sound capture device 102 is held in place using the suspension system. Being acoustically decoupled, sound capture device 102 is suspended from attachment points within musical instrument 106 without using rigid connectors.

Suspension of sound capture device 102 within musical instrument 106 provides a variety of benefits over other conventional techniques for using transducers such as microphones with musical instruments and, in particular, percussion instruments having a stretched membrane. In one aspect, suspension of sound capture device 102 within musical instrument 106 provides improved acoustic isolation between musical instrument 106 and other adjacent or companion instruments. For example, drums are often played in pairs or sets. Congas, for example, are often played in pairs. Other types of drums are played in larger sets such as a drum kit or a trap kit. Inclusion of sound capture device 102 within musical instrument 106 helps to prevent sound capture device 102 from detecting and capturing sounds emanating from other sound sources that are nearby or proximate to musical instrument 106 including other percussion instruments, ambient noise such as wind, and the like. The improved isolation improves the overall quality of the sound captured by sound capture device 102.

Sound capture system 100 and/or sound capture device 102 may be used as a replacement for convention microphones including microphones typically mounted on or around the exterior of the musical instrument. Such other conventional microphones are often positioned above or adjacent to the stretched membrane of the percussion instrument and mounted using stands or clamps. As such, conventional microphones are unable to provide the level of isolation achieved using sound capture system 100. Moreover, ideal placement of conventional microphones for capturing sound generated by a stretched membrane musical instrument is approximately 1 inch above the stretched membrane with approximately a 45-degree angle relative to the plane of the stretched membrane. This microphone positioning, however, often gets in the way of the musician's hands/sticks/mallets and/or otherwise hinders the playing of the musical instrument. Sound capture system 100 and/or sound capture device 102 does not hinder playing of the musical instrument.

Sound capture system 100 provides other benefits over conventional microphones. Sound capture system 100, when used with percussion instruments as described herein, does not obstruct the audience's view of the player, instrument, or other objects on-stage. Because sound capture system 100 need not be removed from musical instrument 106 once installed, the amount of time devoted to microphone placement and setup for live playing and/or recording may be significantly reduced. Further, the placement of sound capture device 102, once properly adjusted within musical instrument 106, need not be adjusted. This also allows the musician playing musical instrument 106 to reposition musical instrument 106 while playing without having to reposition sound capture system 100 or sound capture device 102. Because sound capture device 102 remains in place while musical instrument 106 is moved, whether during transport or onstage during a performance, for example, sound capture system 100 is capable of providing a consistent frequency response and signal level despite movement of musical instrument 106 during use.

Diffusor 112 has a body portion that is hollow and placed inside musical instrument 106. In one or more example implementations, the body portion of diffusor 112 is formed or made of a rigid material such as plastic or cardboard. The body portion of diffusor 112 may be wrapped with a low-density foam, insulation, or sound-absorbing material. Diffusor 112 may include prongs capped with feet that keep diffusor 112 in place. The feet, for example, may be implemented using rubber or neoprene. In one aspect, the body portion of diffusor 112 may be cylindrical in shape. In another aspect, the body portion of diffusor 112 may be contoured such that diffusor 112 is widest at the top (e.g., toward drumhead 116) and tapers or narrows toward the bottom (e.g., the opposite end of musical instrument 106 from drumhead 116). The prongs serve to physically decouple diffusor 112 from the inner surface of musical instrument 106 so as to not dampen the sound of musical instrument 106. The feet prevent the diffusor 112 from moving and also prevent the prongs, e.g., which may be implemented using metal, from rattling or making other undesirable noises.

Optionally, cords may be used in conjunction with the prongs to keep diffusor 112 in place. The cords may be made of elastic, bungee, or other stretchable material. These cords may be coupled to fastening points within the shell 114 and provide enough tension to maintain the diffusor 112 in position even in cases where musical instrument 106 is moved and/or transported.

Diffusor 112 is capable of acting as a diffusor and/or absorber of standing waves that may build up within musical instrument 106, e.g., in the narrower and tapered section of musical instrument 106. Diffusor 112 is hollow to allow air to flow freely through musical instrument 106. The shape of the body portion of diffusor 112 is suited to mitigating standing waves as the sound generated by musical instrument 106 bounces off of the inner walls of a conical enclosure (e.g., inner portion of shell 114) in more complex patterns compared to using a square baffle that would not adequately diffuse the standing wave.

FIG. 1 illustrates an example implementation where sound capture system 100 may be added to an existing musical instrument after manufacture. For example, sound capture system 100 may be retrofitted to existing musical instruments. That is, sound capture system 100 may be added to an existing musical instrument in the field. In other example implementations, sound capture system 100 may be added or included with a musical instrument as part of the manufacturing process, e.g., at the time of manufacture.

Sound capture system 100 provides other benefits compared to conventional microphones placed inside of a stretched membrane percussion instrument. For example, conventional microphones are difficult to mount within stretched membrane percussion instruments. Making electrical and/or audio connections with conventional microphones mounted within stretched membrane percussion instruments is often impractical.

In addition, a conventional microphone is susceptible to capturing a primary standing wave inside the musical instrument that manifests as an offending frequency referred to herein as an "artifact" in the captured audio. In general, the artifact is determined by the dimensions of the interior volume of the musical instrument and the material of the musical instrument. In many cases, a conventional microphone is susceptible to reverberation occurring within the musical instrument that translates into other artifacts in the form of unwanted overtones or unwanted emphasis of certain overtones in the audio spectrum. Conventional microphones are also susceptible to another type of artifact referred to as a "Helmholtz resonance" that is attributed to the tubular design of certain stretched membrane percussion instruments. The Helmholtz resonance translates into a significant amount of low frequency energy, where the particular frequencies are determined by the particular length and geometry of the musical instrument.

Figure 2:
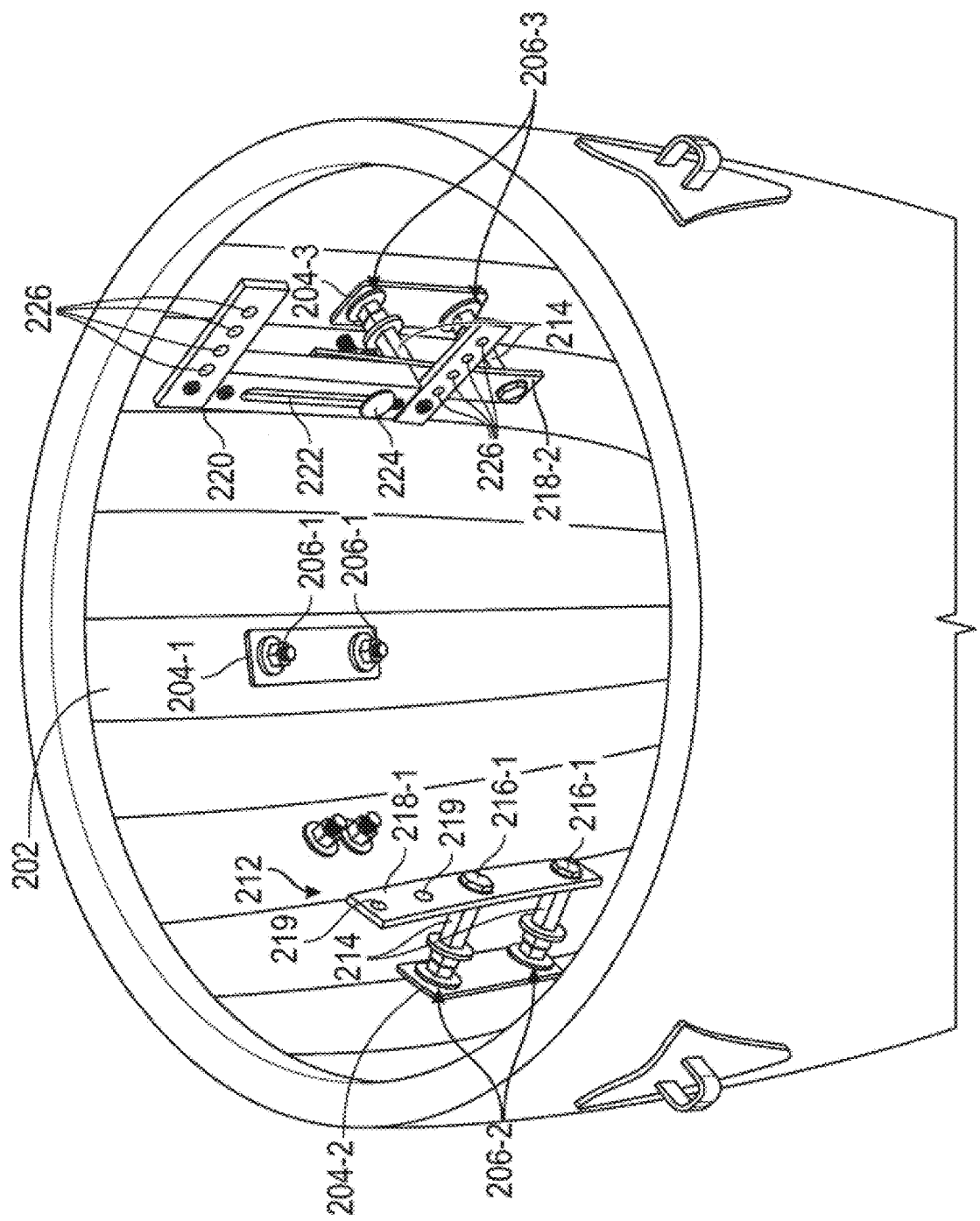
FIG. 2 illustrates example attachment points for use with a suspension system adapted to suspend a sound capture device within a sound-generating object.

FIG. 2 illustrates example attachment points that engage with the suspension system for suspending sound capture device 102 within musical instrument 106. In the example, bolts 206 mount tuning bracket 124 to the outside of shell 114 extend past inner surface 202 of shell 114. In the example, bolts 206 pass through a plate 204. Ends of bolts 206 may be threaded so that a nut and washer may be engaged to maintain tuning bracket 124 securely coupled to the outer surface of shell 114. In the example, plate 204-1 and bolts 206-1 illustrate a conventional mounting of a tuning bracket 124. That is, tuning bracket 124, bolts 206, and plate 204 are part of the standard equipment of a stretched membrane type of percussion instrument.

In the example of FIG. 2, plates 204-1, 204-2, and 204-3 are visible. Plate 204-2 and bolts 206-2 along with plate 204-3 and bolts 206-3 illustrate example attachment points from which universal mounting assemblies 212 may be attached. Each of the universal mounting assemblies 212 is considered part of the suspension system for sound capture device 102. Each universal mounting assembly 212 may include a spacer 214 for each bolt 206 (e.g., 2 spacers 214 per mounting assembly) and a universal mounting plate 218. In one aspect, each spacer 214 may be implemented as a hollow pin that is threaded on the inner surface at each end to receive complementary threaded bolts or fasteners. For example, each spacer 214 may be threaded within the inner surface on each end to engage a respective bolt 206 on a first end and another bolt 216 on the other end. Bolts 216 secure universal mounting plate 218 to spacers 214 and to shell 114.

FIG. 2 also illustrates a C-mount 220 that is fastened to universal mounting assembly 212. C-mount 220 is also a part of the suspension system for sound capture device 102. For purposes of illustrating universal mounting assembly 212, one C-mount 220 is illustrated. It should be appreciated that each universal mounting assembly 212 will have a C-mount 220 coupled thereto. C-mount 220 is generally shaped as a letter "C" with a top leg that is parallel to a bottom leg and with the legs joined by a spine portion perpendicular to each leg. Each leg may include a plurality of apertures 226 that may be used to suspend sound capture device 102.

C-mount 220 may have a slot 222 within the spine portion through which a fastener such as bolt 224 may pass. Bolt 224 may pass through a selected aperture 219 of universal mounting plate 218 and engage a nut to secure C-mount 220 to universal mounting plate 218. As illustrated, C-mount 220 may be adjusted in a direction along an axis (e.g., vertically) that is substantially perpendicular to the plane of drumhead 116, e.g., along the axis defined by universal mounting plate 218. Bolt 224 may be loosened so that C-mount 220 may be moved up and down (e.g., adjusted) along the length of slot 222 to a desired position, whereby bolt 224 may be tightened to hold C-mount 220 in place.

In one or more example implementations, sound absorbing material may be applied to C-mounts 220. As an illustrative example, small foam panels may be adhered to C-mounts 220. The sound absorbing material is capable of reducing higher frequency reverberations that may emanate near drumhead 116. These higher frequency reverberations sound metallic and unpleasant in nature. The sound absorbing material is capable of absorbing these higher frequency reverberations while not dampening the overall sound of musical instrument 106.

In one aspect, the length of spacers 214 may be varied to account for the curvature of inner surface 202 of shell 114 such that universal mounting plate 218 is perpendicular to the plane of drumhead 116. That is, the length of spacers 214 for a same universal mounting plate 218 may be different so that universal mounting plate 218 is perpendicular to drumhead 116 depending on the contour of inner surface 202 of shell 114.

As illustrated in the example of FIG. 2, the hardware added to the inside of musical instrument 106 for suspending sound capture device 102 therein is adjustable and is adapted to the existing hardware of musical instrument 106. The hardware takes advantage of existing hardware, e.g., bolts, that are accessible on the inside and outside of musical instrument 106.

C-mount brackets 218 are attached to spacers 214. As noted, spacers 214 are coupled to the existing hardware of musical instrument 106. Sound capture device 102 may be mounted at a selected and variable distance from the inner surface 202 of shell 114 based on the length of spacers 214 and the size of sound capture device 102. Further, the length of spacers 214 allow universal mounting plate 218 to be mounted substantially vertically despite the curvature of inner surface 202. It should be appreciated that the hardware illustrated in FIG. 2 may be formed or machined for compatibility with specific instrument brands, makes, and/or models. In other examples, a "universal" mounting kit may be used across a plurality of different instrument brands, makes, and/or models.

Figure 7:
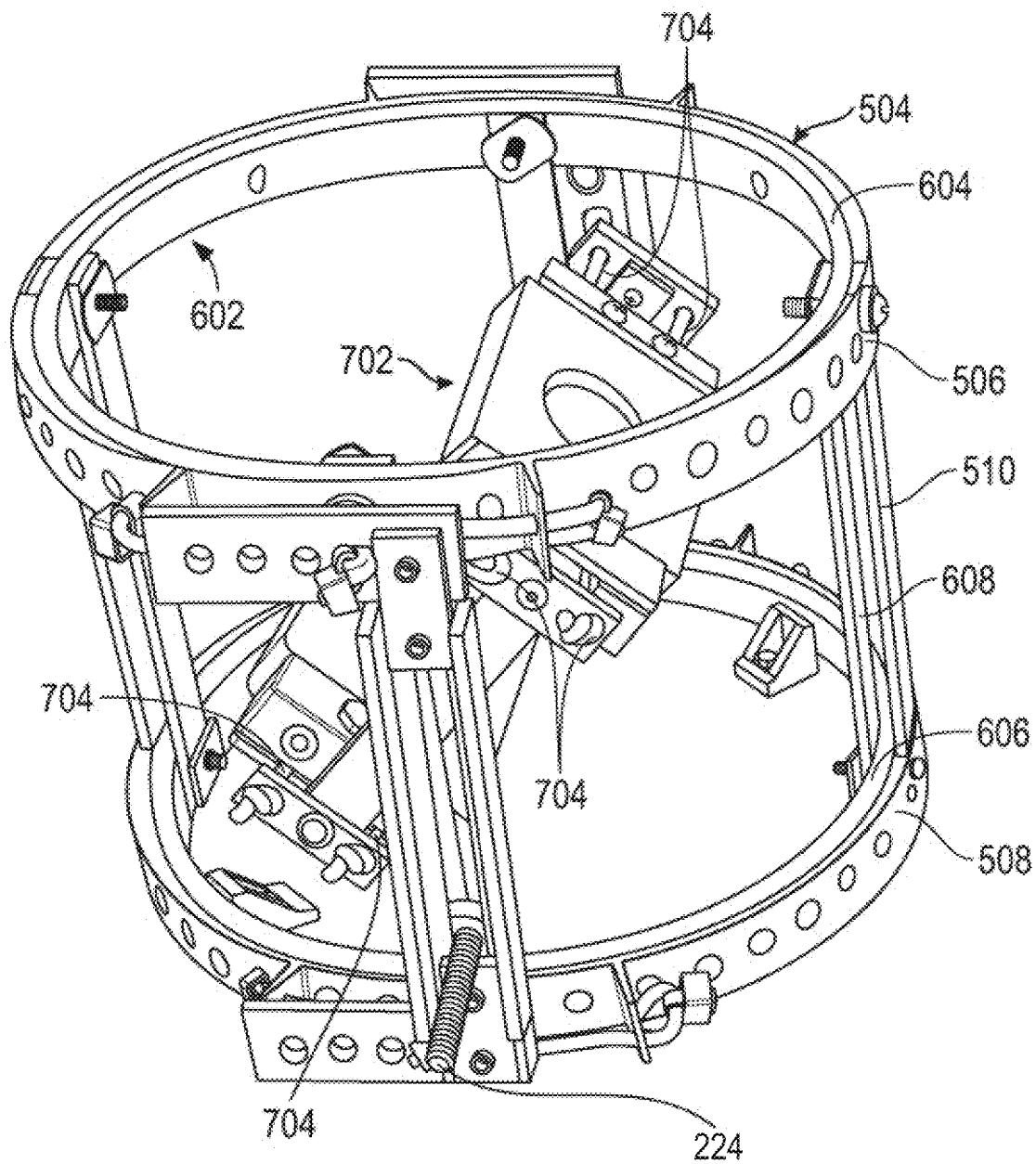
FIG. 7 illustrates another example of a sound capture device with shielding and protective covering(s) removed.

Attaching the C-mounts 220 to C-mount brackets 218 allows C-mounts 220, and thus sound capture device 102, to be raised or lowered within musical instrument 106. In one aspect, C-mounts 220 may be attached to sound capture device 102 first and then attached to C-mount brackets 218 by way of bolts 224. This allows sound capture device 102 lowered into musical instrument 106 and affix sound capture device 102 to the musical instrument 106 with a single attachment point (e.g., one bolt 224) on each side as shown in FIG. 7. Raising moves sound capture device 102 closer to drumhead 116 (e.g., closer to the top of musical instrument 106), while lowering moves sound capture device 102 farther away from drumhead 116 (closer to the bottom of musical instrument 106). Different apertures 226 in the horizontal legs of C-mounts 220 allow sound capture device 102 to be moved side-to-side in the plane of drumhead 116 to ensure that sound capture device 102 does not contact inner surface 202.

In general, universal mounting assembly 212 and the attached C-mounts 220 may be implemented with a low profile while still maintaining the structural integrity necessary to withstand stress from a dynamic load, which is sound capture device 102 suspended therefrom. The adjustability of universal mounting assembly 212 and the attached C-mounts 220 in the horizontal (parallel to drumhead 116) and vertical (perpendicular to drumhead 116) directions allow sound capture device 102 to be positioned within the musical instrument 106 based on the shape of musical instrument 106 and the position of existing hardware of musical instrument 106 to ensure consistent transducer placement.

Figure 3:
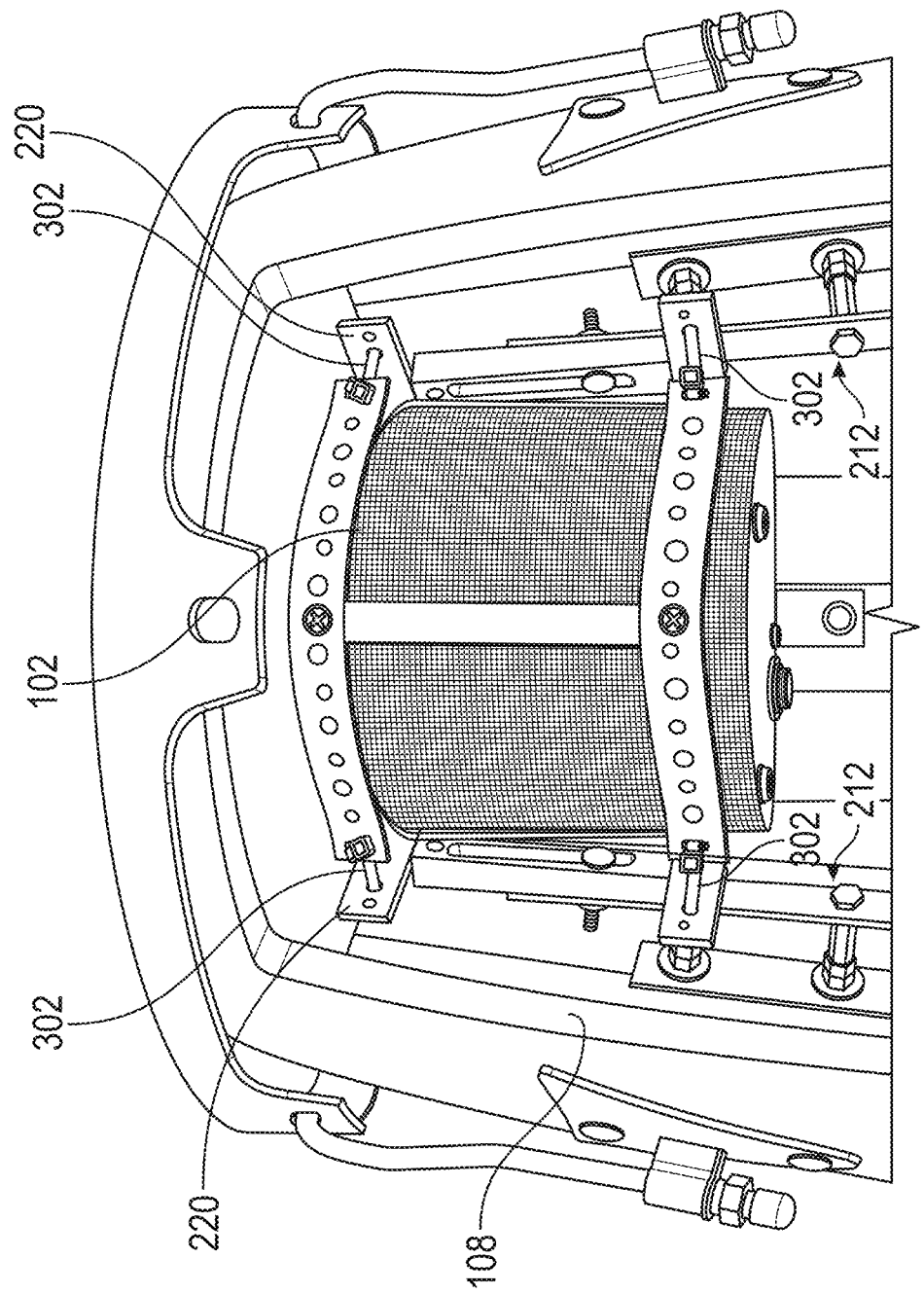
FIG. 3 illustrates an example of a suspension system used to suspend a sound capture device within a sound-generating object.

FIG. 3 illustrates an example of the suspension system used to suspend sound capture device 102 within musical instrument 106. In the example of FIG. 3, sound capture device 102 is visible within musical instrument 106 though cutaway 108. The suspension system, which includes two universal mounting assemblies 212, each with a C-mount 220 attached thereto, is used to suspend sound capture device 102 within musical instrument 106. In the example, sound capture device 102 is suspended using a plurality of cords 302, which are considered part of the suspension system for the sound capture device. Cords 302 may be formed of a stretchable or flexible material. In one or more example implementations, cords 302 may be implemented using a stretchable material such as bungee cord. In one or more other example implementations, cords 302 may be implemented using rubber, elastic, and/or other stretchable and/or resilient materials. In one or more example implementations, cords 302 may be implemented with any of a variety of cross-sectional shapes such as circular, oval, rectangular, square, etc.

Figure 4:
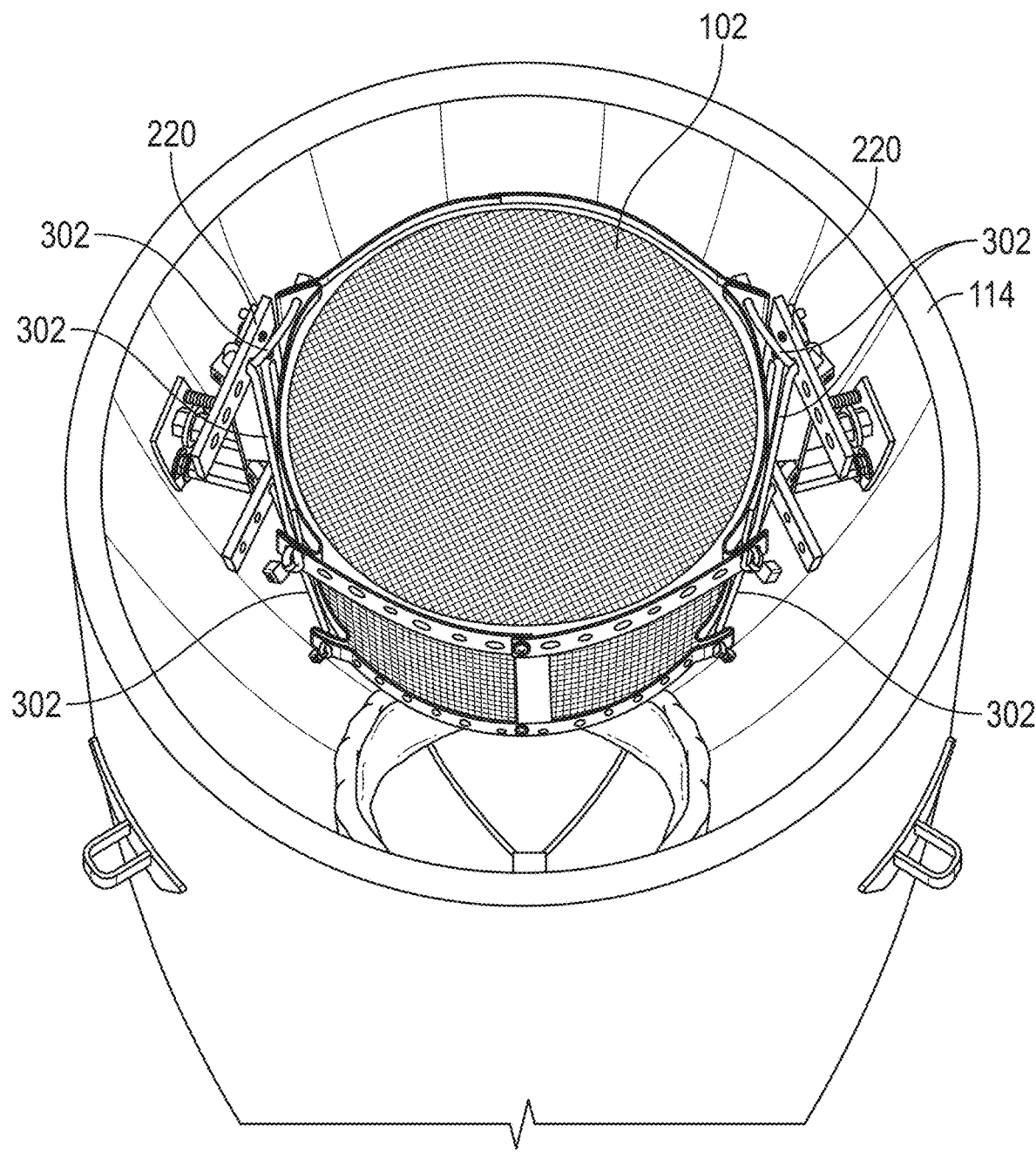
FIG. 4 illustrates an overhead view of a sound-generating object with an example sound capture device suspended therein.

FIG. 4 illustrates an overhead view of musical instrument 106 with sound capture device 102 suspended therein using the suspension system. In the example of FIG. 4, drumhead 116 and rim 118 are removed from musical instrument 106 to expose the interior of musical instrument 106. In the example of FIG. 4, sound capture device 102 is suspended using the suspension system comprising two universal mounting assemblies 212, each having a C-mount 220 attached thereto, and using cords 302. As illustrated in the example, one (or more) tuning brackets may be disposed between the two tuning brackets 124 to which the universal mounting assemblies 212 are coupled.

In the example, cords 302 suspend sound capture device 102 from C-mounts 220. In the example, sound capture device 102 is coupled to the top portion (e.g., leg) of each C-mount 220 using one cord 302 looped through an aperture 226 of the top leg. Sound capture device 102 is also coupled to the bottom portion (e.g., leg) of each C-mount 220 using one cord 302 looped through an aperture 226 of the bottom leg. In the example, a total of 4 cords 302 are used to suspend sound capture device 102 within the interior portion of musical instrument 106. As illustrated, ends of the cords 302 may be knotted or knotted around an object to prevent the cords from being pulled out of the apertures through which cords 302 were drawn.

In one or more example implementations, sound capture device 102 is suspended using cord 302 having sufficient strength and tension so as to prevent sound capture device 102 from contacting any interior surface of shell 114, the under-side of drumhead 116, universal mounting assembly 212, C-mount 220, or other portion of musical instrument 106. This prevents unwanted rattling, noise, or vibrations when musical instrument 106, with sound capture device 102 suspended therein, is shaken vigorously as may occur during a theatrical and/or lively live performance. Certain performers, for example, Ray Barreto, were known for their lively conga performances. The suspension of sound capture device 102 within musical instrument 106, for example, may withstand the vigorous shaking of musical instrument 106 that may occur to avoid generating unwanted audio artifacts from sound capture device 102 contacting any of the various surfaces described.

Figure 5A:
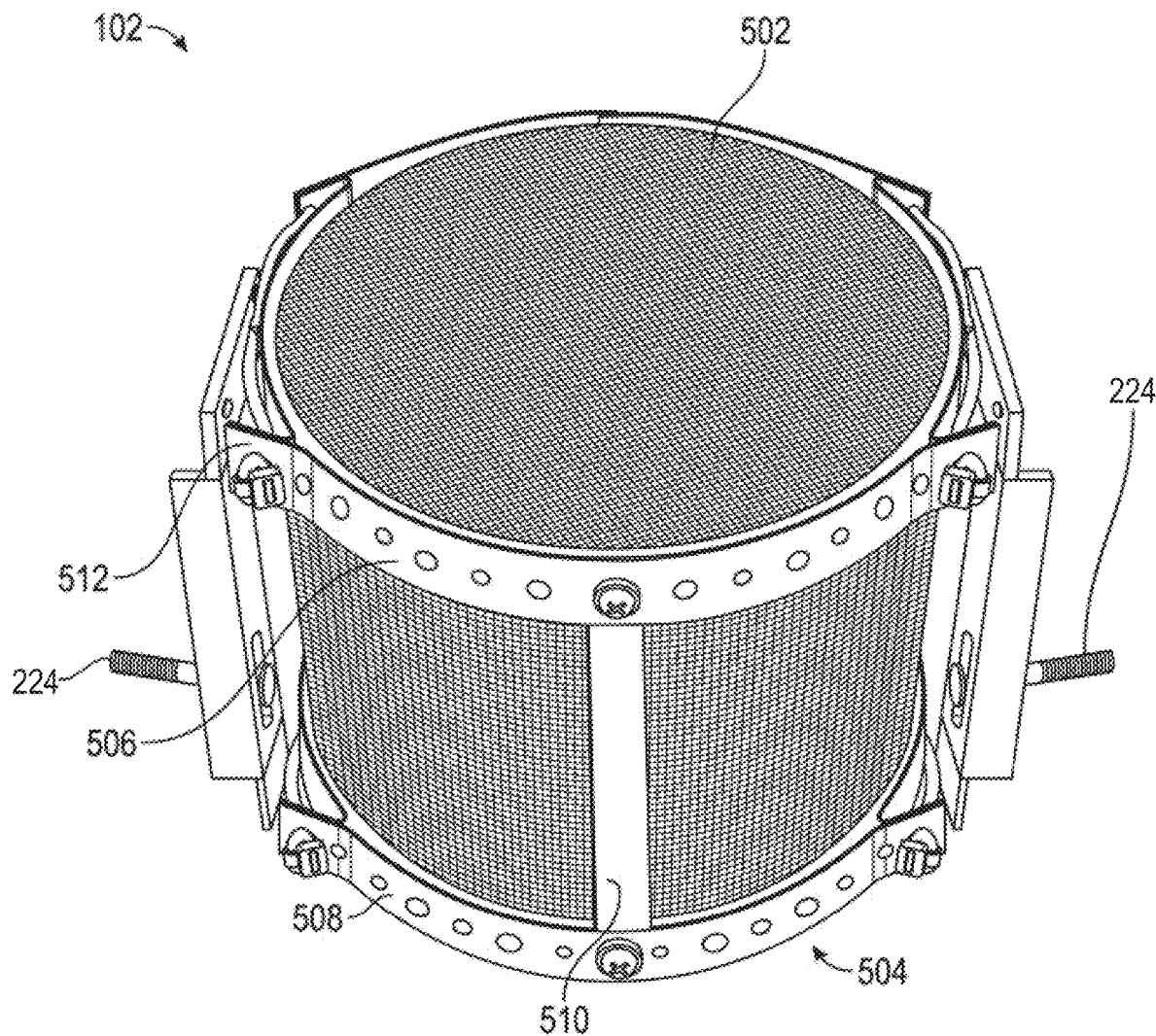
FIGS. 5A and 5B illustrate certain operative features of an example sound capture device.

FIG. 5A illustrates certain operative features of sound capture device 102. In the example of FIG. 5A, sound capture device 102 is wrapped in, or encompassed by, shielding 502. Shielding 502 may be a metallic mesh that provides electromagnetic (e.g., radio-frequency or RF) shielding for the transducer assembly located therein. As shown, sound capture device 102 has an outer frame 602 that is formed of an upper frame strap 506, a lower frame strap 508, and a plurality of outer supports 510 that are arranged perpendicular to frame rings 506, 508. In the example, upper frame strap 506 includes four tabs 512 to which cords 302 attach (e.g., are pulled through). In one or more examples, a pair of tabs 512 may be coupled to an aperture 226 of C-mount 220 by a cord 302. In such an example, sound capture device 102 is suspended using the suspension system using 4 cords 302. In another example, each tab 512 may be coupled to an aperture 226 of C-mount 220 by an independent cord 302. In the latter case, sound capture device 102 is suspended using the suspension system using 8 cords 302.

In one or more other examples, the suspension system may include more than 2 universal mounting assemblies with attached C-mounts 220. For example, 3 or 4 such universal mounting assemblies may be used where each has an attached C-mount 220 and each is coupled to sound capture device 102 by one or more cords 302. In this regard, the number of universal mounting assemblies with attached C-mounts used to suspend sound capture device 102 is not intended as a limitation so long as sound capture device 102 is prevented from contacting the inner portion of shell 114 or other components located within musical instrument 106. Further, it should be appreciated that the number of cords 302 used to suspend sound capture device 102 within musical instrument 106 from each universal mounting assembly and attached C-mount is not intended to be limiting. For example, on each leg of C-mount 220, one, two, or more cords 302 may be used to suspend sound capture device 102.

In the example of FIG. 5A, each of bolts 224 may serve as a single point of contact or connection between sound capture device 102 and each universal mounting assembly 212.

In another aspect, in addition to shielding 502, a further protective layer may be included and used to wrap sound capture device 102 to prevent dust from entering the inside of sound capture device 102. The further protective layer (not shown) may be implemented as a cloth and/or mesh. The further protective layer may be stretchable and within the shielding 502. In another example implementation, a second protective layer for dust may be external to shielding 502. In still another example implementation, one or more such protective layers may be included inside of shielding 502, outside of shielding 502, or both inside and outside of shielding 502. The further protective layer or layers, as the case may be, are capable of providing additional acoustic dampening properties that reduce transients that may occur when musical instrument 106 is struck. Such transients may generate significant voltages that, in some cases, if not dampened as described, may overload certain portions of signal processing circuit 104.

Figure 5B:
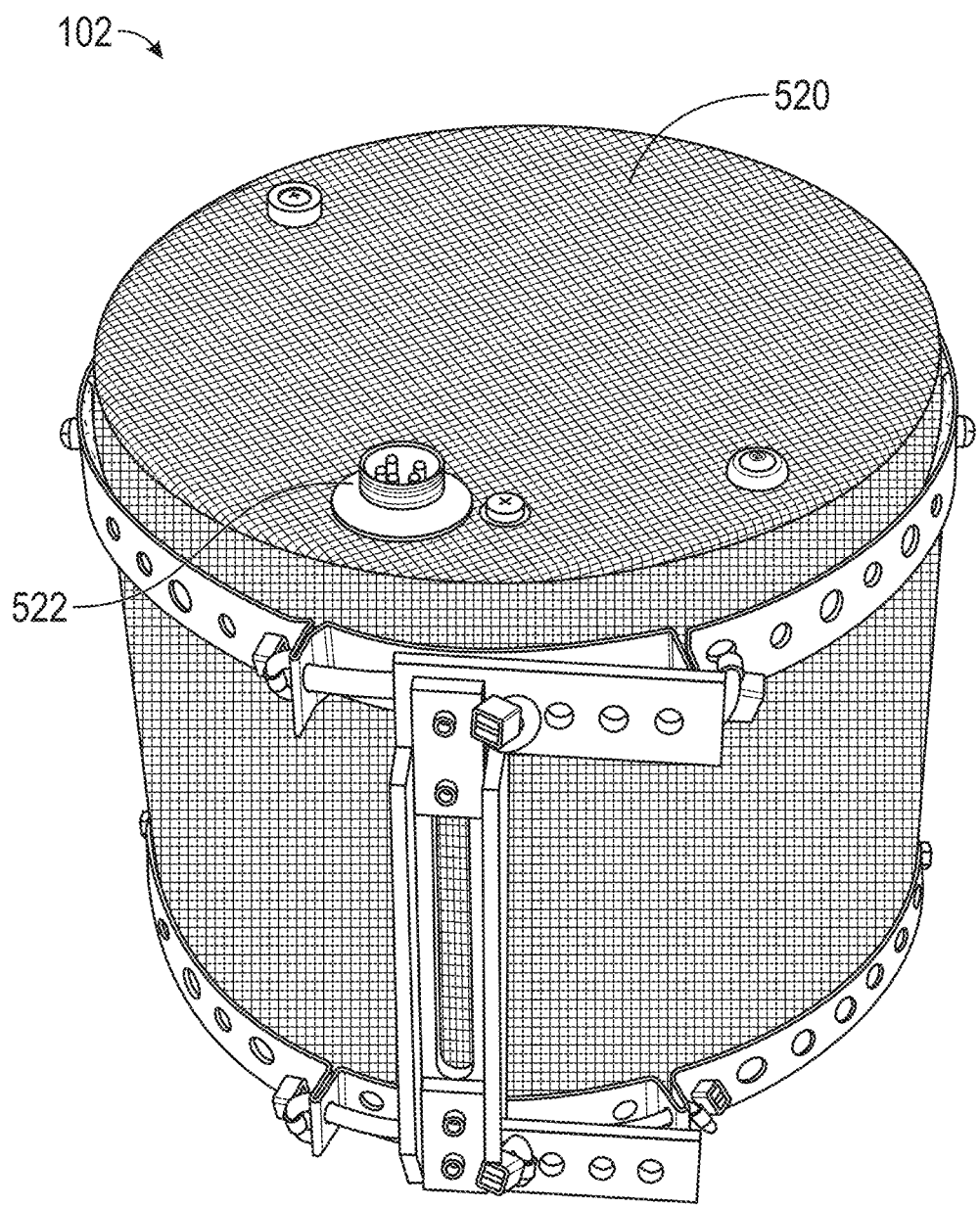

FIG. 5B illustrates certain operative features of sound capture device 102. In the example of FIG. 5B, sound capture device 102 includes a top section and a bottom lid 520. In the example, sound capture device 102 is inverted or upside-down so that bottom lid 520 is showing and the top section is hidden from view. The top section and bottom lid may be wrapped or covered as described in connection with FIG. 5A. That is, the top section and bottom lid may be covered with shielding 502, and one or more further protective layers (e.g., dust covers) that may be located inside of shielding 502, outside of shielding 502, or both inside and outside of shielding 502. In the example of FIG. 5B, top lid 520 is fitted with a multi-pin connector 522 (e.g., an audio connector) that is connected to the transducers included within sound capture device 102. In the example, multi-pin connector 522 is a 5-pin connector. When suspended within musical instrument 106, multi-pin connector 522 may be oriented downward toward the ground to provide signals generated by the transducers included in sound capture device 102 to signal processing circuit 104.

Figure 6:
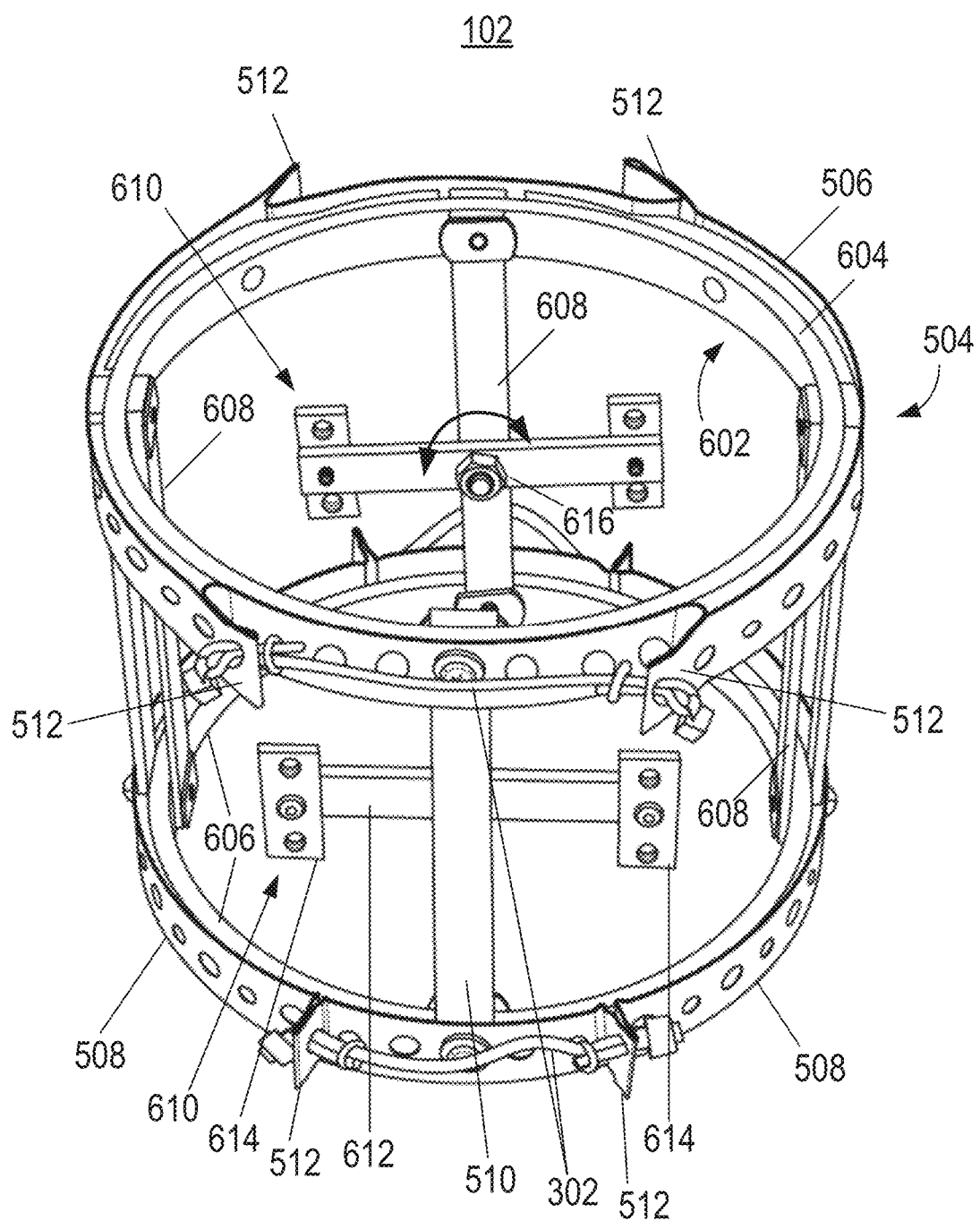
FIG. 6 illustrates an example of certain structural features of a sound capture device.

FIG. 6 illustrates an example implementation of certain structural features of sound capture device 102. In the example, shielding 502 and any dust covers have been removed to better illustrate structural aspects of sound capture device 102. In the example, sound capture device 102 includes outer frame 504 and an inner frame 602. Inner frame 602 is formed of an upper frame ring 604, a lower frame ring 606, and a plurality of inner supports 608 arranged perpendicular to frame rings 604, 606. In general, upper frame ring 604 is concentric with upper frame strap 506. Upper frame ring 604 and upper frame strap 506 may be attached using a plurality of fasteners. Lower frame ring 606 is concentric with lower frame strap 508. Lower frame ring 606 and lower frame strap 508 may be attached using a plurality of fasteners. Inner supports 608 may be aligned with outer supports 510. Outer supports 510 may be attached to upper frame strap 506 and lower frame strap 508 as shown. Inner supports 608 may be attached to upper frame ring 604 and lower frame ring 606 as shown. In one aspect, shielding 502 and the additional protective layers may be disposed between inner frame 602 and outer frame 504.

In the example of FIG. 6, elements of outer frame 504 such as upper frame strap 506, lower frame strap 508, the plurality of outer supports 510, and tabs 512 are shown in greater detail. In the example, upper frame strap 506 and lower frame strap 508 each has four tabs 512 to which cords 302 attach. The engagement of cords 302 to tabs 512 can be seen where cords 302 are looped and extend through a hole or aperture of tabs 512. In the example of FIG. 6, 4 cords 302 are used to suspend sound capture device 102. As noted, in other example implementations, a different number of cords 302 may be used. For example, each tab 512 may be coupled to an aperture 226 of C-mount 220 by a cord 302. The cord 302 may be drawn through an aperture 226 of C-mount 220 and secured using a pin or other mechanism that prevents cord 302 from becoming disengaged from aperture 226.

In the example of FIG. 6, each of two I-connectors 610 is coupled to a different inner support 608 of inner frame 602. Inner supports 608 to which the !-connectors 610 attach are disposed at opposing ends of a diameter of upper and/or lower frame rings 604, 606. Each I-connector 610 includes a stem 612 and two edges 614 arranged perpendicular to stem 612. In the example, stems 612 are rotatably coupled to inner supports 608 via a connector 616. In an example, each connector 616 may be a threaded bolt with a fastener such as a nut configured to engage the threaded bolt. The connector 616 that is closer in the perspective view is obscured by outer support 510. Each I-connector 610 is capable of rotating around the axis defined by the connector 616. Each I-connector 610 may be adjusted to a desired position with connector 616 being tightened to maintain the respective I-connector 610 in the desired position.

Inner frame 602 and outer frame 504 maybe formed of the same or different material. In one example, outer frame 504 may be formed of metal, while upper and lower frame rings 604, 606 are formed of plastic such as polyvinyl chloride (PVC). In the examples illustrated herein, outer supports 510, 608 may be formed of metal or another material of suitable strength to support suspension of the transducer assembly 702 therefrom.

For purposes of description, inner frame 602 and outer frame 504 of sound capture device 102 may be referred to collectively as the "frame structure" of sound capture device 102. In one or more other embodiments, however, the frame structure may be implemented as a unified structure rather than including an inner frame and an outer frame. The inventive arrangements are not intended to be limited to a frame structure having both an inner frame 602 and an outer frame 504.

FIG. 7 illustrates another example implementation of sound capture device 102 with shielding 502 and protective covering(s) removed. Sound capture device 102 includes a transducer assembly 702 disposed therein. Within sound capture device 102, transducer assembly 702 is suspended using an inner suspension system that attaches to the frame structure of sound capture device 102. The inner suspension system may include the I-connectors 610 of FIG. 6. In general, transducer assembly 702 is suspended from an I-connector 610 on each end. Transducer assembly 702 may be suspended from inner frame 602, e.g., from I-connectors 610, by way of a plurality of inner cords 704 similar to the manner in which sound capture device 102 is suspended within musical instrument 106 using the suspension system with cords 302 as previously described. The suspension of transducer assembly 702 using inner cords 704 in combination with cords 302 creates a double suspension system for transducer assembly 702, where the double suspension system is formed of the suspension system used to suspend sound capture device 102 (e.g., an outer suspension system) and the inner suspension system used to suspend transducer assembly 702 within sound capture device 102.

Figure 8:
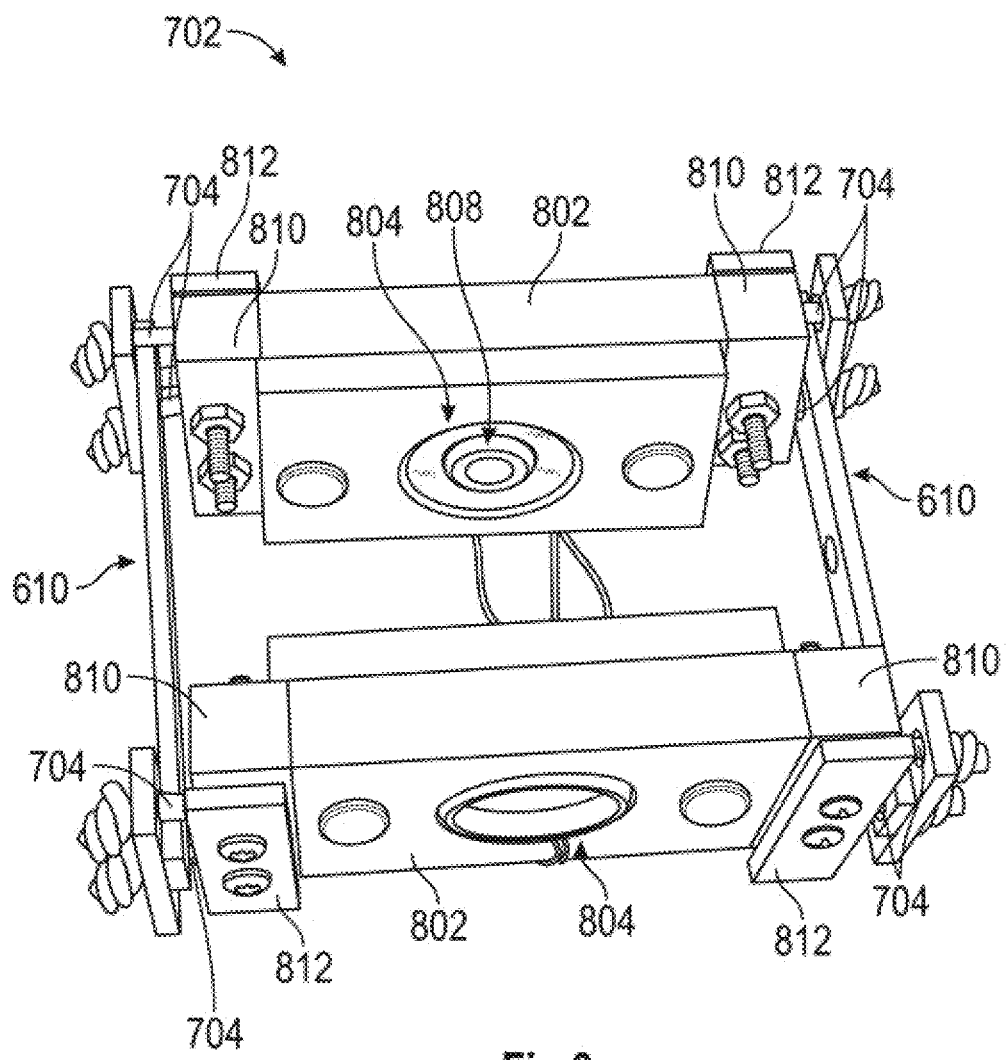
FIG. 8 illustrates an example of a transducer assembly.

FIG. 8 illustrates an example implementation of transducer assembly 702. In the example, transducer assembly 702 is coupled to an I-connector 610 on each edge by cords 704. Transducer assembly 702 includes two transducer housing blocks 802, with each transducer housing block 802 having a transducer 804 securely disposed therein.

In one or more example implementations, each transducer 804 may be hardened with respect to electromagnetic interference. For example, each of transducers 804 may be implemented as a humbucking microphone capsule. The humbucking microphone capsules used may be parts that are commercially available. A humbucking microphone capsule includes a primary coil that is configured to function as a microphone element to capture audio, e.g., sound waves. The primary coil also captures electromagnetic interference (EMI). The humbucking microphone capsule includes a secondary coil that is not configured to capture audio, but rather capture only EMI. The two coils are wired in series with the primary coil and the secondary coil being 180 degrees, or substantially 180 degrees, out of phase so that the EMI cancels out leaving the audio signal as an output. The EMI is unwanted as the EMI can create audible noise artifacts including, but not limited to, 60 cycle hum in the audio output signal.

In the example of FIG. 8, each of transducers 804 includes a primary coil (not shown) that is configured to capture audio and electromagnetic interference and a secondary or "noise" coil 808 that is configured to detect electromagnetic interference, but no audio. Due to the viewing angle of FIG. 8, only one secondary coil is visible as part of the humbucking microphone capsules. It should be appreciated, however, that each transducer 804, e.g., implemented as a humbucking microphone capsule, includes both a primary coil and a secondary coil 808.

Transducers 804 may be implemented in any of a variety of different sizes. It should be appreciated that larger sized transducers 804 (e.g., humbucking microphone capsules having coils with larger diameters) may be capable of capturing lower frequencies with greater fidelity. For purposes of illustration, in the example of FIG. 8, each transducer 804 has a diameter of 1.25 inches. It should be appreciated, however, that different sized transducers may be used. In the example of FIG. 8, transducers 804 are matched (e.g., are the same).

In one or more examples, each transducer 804 may be implemented using a housing, e.g., a plastic or metal housing. The housing may be cylindrical and include a moving diaphragm that is attached to the primary coil. Movement of the diaphragm from changing sound pressure levels causes the primary coil to move with respect to a fixed magnet thereby inducing current. Secondary coil 808 is wired in series with the primary coil, where the orientation of the windings of secondary coil 808 are placed out-of-phase with the windings of the primary coil. The primary coil and secondary coil 808 may be wired 180 degrees, or substantially 180 degrees, out of phase so that the electromagnetic interference is canceled. As noted, in one or more examples, each transducer 804 may be implemented using any of a variety of commercially available humbucking microphone capsules.

In one or more example implementations, each transducer housing block 802 may be formed of an acoustically inert material. In an example, each transducer housing block 802 is formed of wood. In another example, each transducer housing block 802 is made from a plastic material. An example plastic material that may be used to implement transducer housing blocks 802 is a plastic polymer such as polyvinyl chloride or "PVC."

Each transducer 804 may couple to signal processing circuit 104 via a plurality of conductors or wires. Signal processing circuit 104 may couple to each transducer 804 via a positive conductor, a negative conductor, and ground conductor, where the ground conductors of both transducers 804 are coupled together forming a common ground. Signal processing circuit 104 receives the 5 conductors or wires from transducer assembly 702. That is, transducers 804 may be coupled to connector 522, which includes 5 pins.

In an example implementation, each transducer 804 is mounted in transducer housing block 802. Transducer housings 802 may be implemented with varied dimensions so long as each transducer housing block 802 includes a transducer therein and is able to fit within musical instrument 106 as described herein. In one aspect, each transducer housing block 802 may include an aperture in which each transducer 804 may be pressed-fitted and glued or otherwise secured.

In the example, transducer housings 802 are coupled to I-connectors 610 so transducer housings 802 are facing each other. That is, the secondary coils 808 of each transducer housing, in the example, inwardly faces the other. The two humbucking microphone capsules face inward towards one another.

In one or more examples, each transducer housing block 802 may include a body portion to which each transducer 804 is mounted. The body portion may be flanked by edges 810 formed of a higher density material of greater weight than the body portion. The edges 810 add mass to the transducer housings 802 thereby lowering the resonant frequency of transducer assembly 702. In one example, the resonant frequency is lowered to a frequency that is inaudible by a human being, e.g., below the lowest audible frequency heard by human beings.

In the example of FIG. 8, inner cords 704 may couple to edges 810 through a clamping action as shown where an edge plate 812 may be secured and tightened down against edges 810 to secure inner cords 704. The other edge of inner cords 704 may extend through the apertures of edges 614 of I-connectors 610. In an example implementation, the inner suspension system may include the I-connectors 610, inner cords 704, and the connection mechanism for connecting or coupling inner cords 704 to the transducer assembly 702 (e.g., the edges 810 and edge plate 812).

Figure 9:
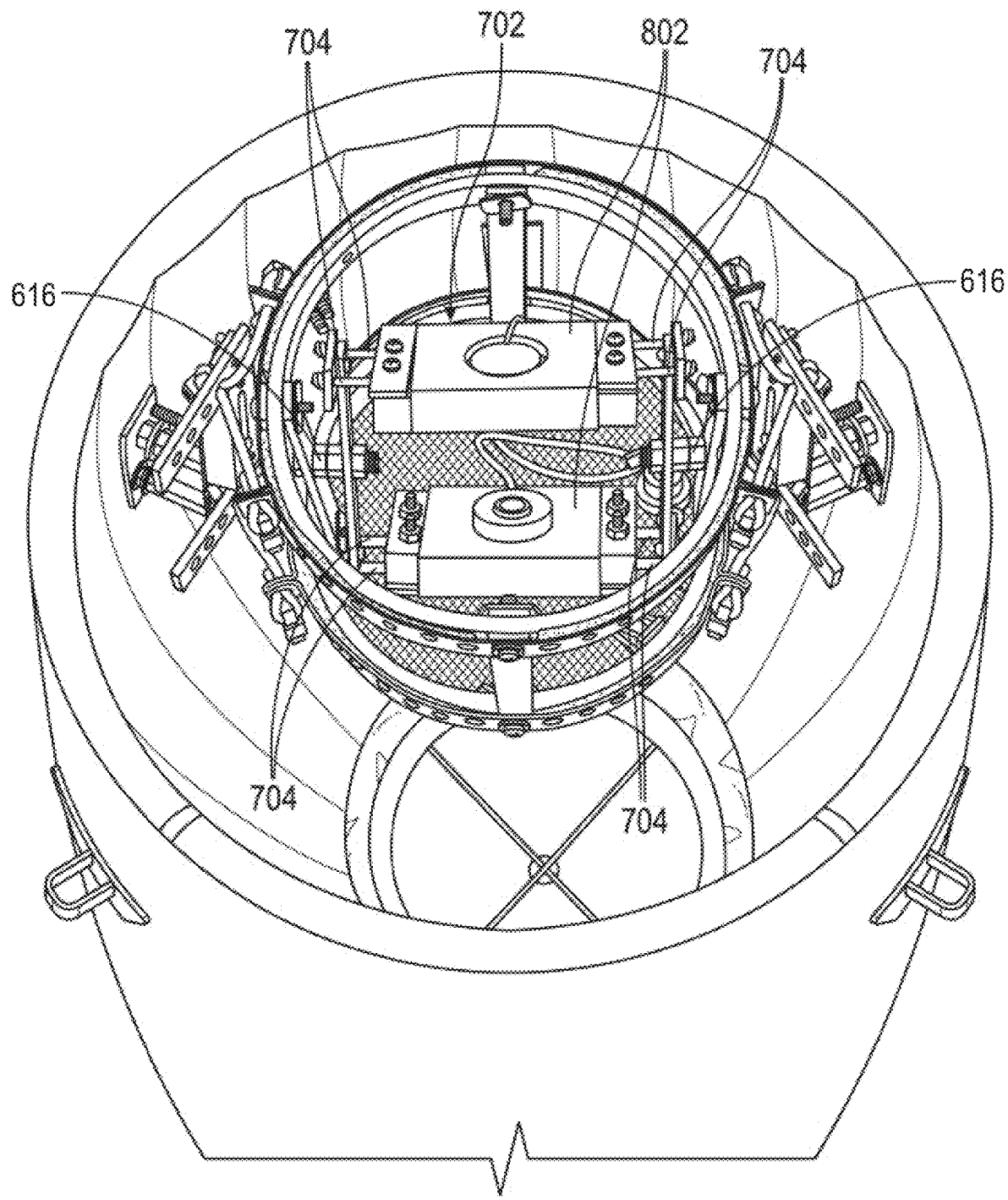
FIG. 9 illustrates an example of a transducer assembly disposed within a frame structure of a sound capture device.

FIG. 9 illustrates an example implementation in which transducer assembly 702 is disposed within the frame structure of sound capture device 102. In the example of FIG. 9, transducer assembly 702 is capable of rotating about an axis formed of connectors 616. Once rotated to a desired angle, connectors 616 may be tightened to hold transducer assembly 702 at the set angle. In one aspect, connectors 616 may be formed of a plurality of connectors, e.g., a connector assembly.

In accordance with the inventive arrangements described herein, using two transducers 804 provides a variety of different benefits. For example, using two transducers 804 facilitates the cancelation of unwanted resonance artifacts emanating from musical instrument 106. Use of two transducers 804 is capable of increasing the signal-to-noise ratio of the resulting audio output. Use of two transducers 804 is capable of increasing the acoustic isolation between musical instrument 106 and other adjacent undesired sound sources whether companion instruments and/or environmental conditions (e.g., wind).

Similar to the acoustic isolation achieved with respect to sound capture device 102, use of inner cords 704 facilitates the acoustic isolation of transducer assembly 702. Inner cords 704 ensure that transducer assembly 702 does not contact any part of the frame structure of sound capture device 102 and/or shielding 502. Thus, transducer assembly 702 is suspended within sound capture device 102 and acoustically isolated therefrom. Inner cords 704 may be formed of the same or similar material as cords 302 and tensioned so that vigorous movement of musical instrument 106 does not cause transducer assembly 702 to contact the frame structure of sound capture device 102 and/or shielding 502.

The dual suspension system, in reference to the use of the inner and outer suspension systems, also serves to reduce and/or eliminate certain audio artifacts such as low frequency signals sometimes referred to as "rumble." These low frequency signals may arise from playing musical instrument 106 or from vibrations transmissible via the stage, floor, or ground to musical instrument 106.

In the example implementations described herein, inner cords 704 suspend transducer housings 802 so that transducer housings 802 are capable of moving in the same direction as the diaphragms of transducers 804. This makes transducers 804 less susceptible to strong vibrations from any other axis and effectively functions as a mechanical high-pass filter. That is, inner cords 704 effectively reduce low frequency noise that may otherwise be present in the audio signals that are generated by sound capture device 102.

Figure 10:
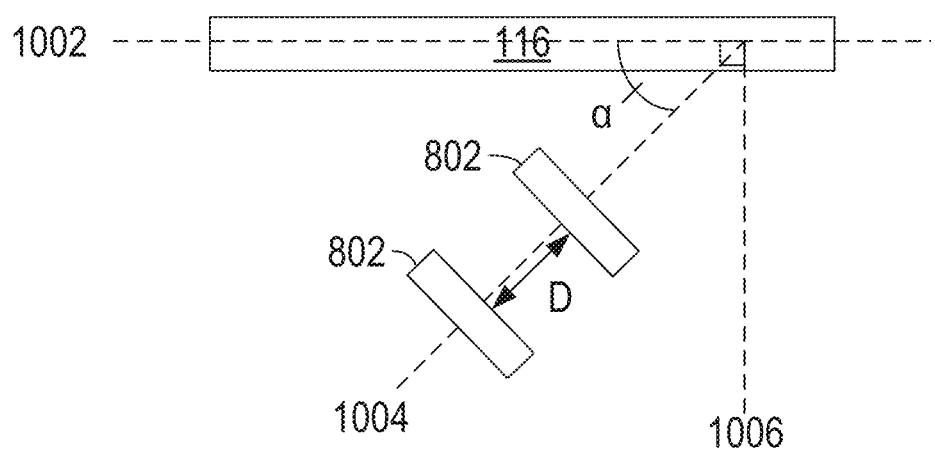
FIG. 10 illustrates an example orientation of a transducer assembly disposed within a sound-generating object.

FIG. 10 illustrates an example orientation of transducer assembly 702 as installed within musical instrument 106. In one aspect, the distance "D", as illustrated in the example of FIG. 10, separating the two transducers 804 may be greater than or equal to the diameter of the diaphragm of the transducer. In the example of FIG. 10, drumhead 116 is parallel with plane 1002. Axis 1006 is perpendicular to plane 1002. In the example of FIGS. 9 and 10, transducer assembly 702 is oriented, e.g., rotatably positioned, so that angle $\alpha$ is approximately 45-degrees. That is, transducer housings 802 (having transducers 804 therein) are aligned on axis 1004 so that the angle formed by the axis 1004 and plane 1002 is approximately 45-degrees. The angle $\alpha$ may be adjusted to account for one or more modes of vibration of drumhead 116 (e.g., the stretched membrane). While FIG. 10 illustrates angle $\alpha$ as being 45-degrees, it should be appreciated that other values for angle $\alpha$ may be used and that the inventive arrangements described herein are not intended to be limited to such angles. Rather, angle $\alpha$ may be lower or higher than 45-degrees. The example implementations described herein allow angle $\alpha$ to be adjustable. For example, the angle $\alpha$ may have an angle that is greater than 0° and less than 90°.

Sound capture system 100 and, more particularly, sound capture device 102 with the configuration described in connection with FIGS. 9-10, is capable of accurately capturing various modes of vibration that are characteristic of certain stretched membrane percussion instruments. The transducer assembly 702, for example, may be oriented as illustrated in FIG. 10 to more accurately capture various vibrational modes of musical instrument 106 that characterize the sound emanating from the musical instrument 106.

In one aspect, the rotation of transducer assembly 702, as described in connection with FIG. 10, allows transducer assembly 702 to more accurately capture the respective amplitudes of the fundamental and first two overtones (e.g., harmonics) generated by musical instrument 106. In some cases, positioning transducer assembly 702 parallel to drumhead 116 (e.g., angle $\alpha=0°$ or 180°) or perpendicular to drumhead 116 (angle $\alpha=90°$ or 270°), results in the fundamental and/or one or more of the overtones having different amplitude relationships among themselves than is the case when capturing the sound of the musical instrument 106 using an external microphone and as heard by a human being.

The positioning of transducer assembly 702 also contributes to the removal of an unwanted interior resonance of musical instrument 106 referred to as the "Helmholtz resonance" that may be present. The Helmholtz resonance refers to a low frequency note developed in the case of a tubular instrument that is closed on one end (e.g., a stretched membrane percussion instrument).

Figure 11A:
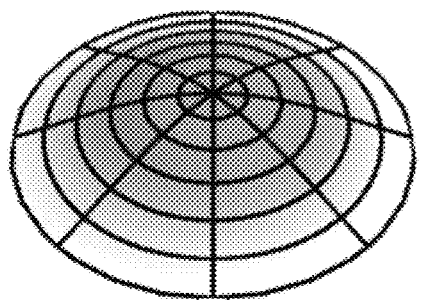
FIGS. 11A, 11B, and 11C illustrate example vibration modes of a stretched membrane of a percussion instrument.
Figure 11A:
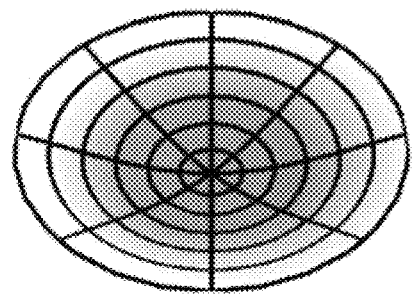
Figure 11B:
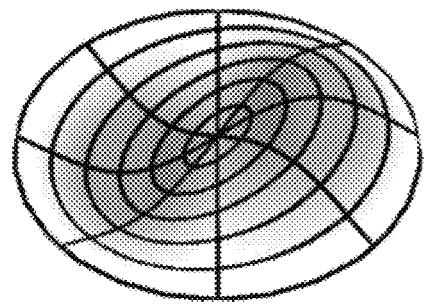
Figure 11B:
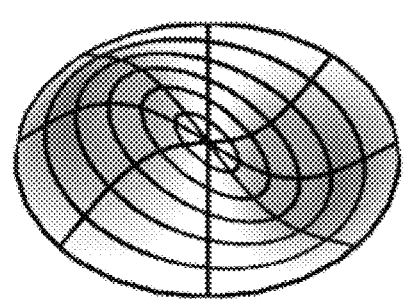
Figure 11C:
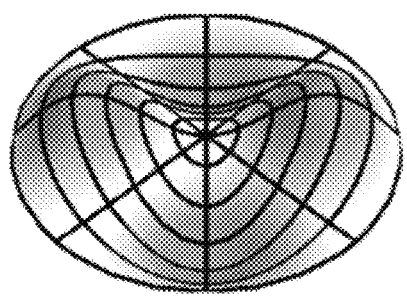
Figure 11C:
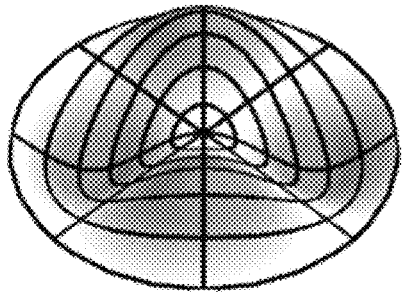

FIGS. 11A, 11B, and 11C illustrate different modes of vibration of a stretched membrane percussion instrument that the inventive arrangements are adapted to capture. The different modes of vibration illustrated in FIGS. 11A, 11B, and 11C often characterize the movement of the stretched membrane of a percussion instrument when a user or musician applies different strokes while playing. FIG. 11A illustrates mode (0,1). FIG. 11B illustrates mode (1,1). FIG. 11C illustrates mode (2,1). The stretched membrane of a percussion instrument may have movement that coincides with one or more modes of vibration as illustrated in FIGS. 11A, 11B, and 11C as well as more complex modes of vibration not illustrated in FIGS. 11A, 11B, and 11C. Transducer assembly 702, as positioned in sound capture device 102, is capable of accurately capturing one or more of the various modes of vibration that characterize the sound of a stretched membrane percussion instrument.

Having described sound capture device 102 and other hardware that facilitates suspension of sound capture device 102 within musical instrument 106, the following discussion provides additional information concerning the positioning of sound capture device 102 within musical instrument 106. In terms of vertical positioning, the distance from drumhead 116 to the existing musical instrument hardware to which sound capture device 102 is suspended may vary from one musical instrument to another. For example, the top lug bolt of a first drum may be approximately 5.5" from the drumhead, while the top lug bolt of a second drum may be approximately 5.375" away from the drumhead. Different manufacturers may vary widely in this regard. The adjustability of the C-mount 220 with respect to the universal mounting plate 218 accounts for this variability allowing sound capture device 102 to be positioned at a uniform distance or a desired distance from drumhead 116 in different sized percussion instruments.

In determining the vertical position of sound capture device 102, e.g., the distance from drumhead 116 to sound capture device 102, several different factors may be considered. These factors can include, but are not limited to, signal gain, the so called "Barreto" test previously described, and sympathetic resonance. Sympathetic resonance refers to the phenomenon where a drumhead such as drumhead 116 is not activated by touch, but rather by the sound emanating from, or generated by, another drum proximate thereto.

With respect to signal gain, the smaller the distance between sound capture device 102 and drumhead 116, the higher the sound pressure level (SPL) and, as such, the larger the signal gain produced by sound capture device 102. Correspondingly, the larger the distance between sound capture device 102 and drumhead 116, the lower the SPL and the lower the signal gain produced by sound capture device 102. Larger distances also allow a greater opportunity for unwanted noise to be detected by sound capture device 102. Unwanted noise or unwanted signals may include, but are not limited to, interior resonances, low frequency rumble, and ambient noise. The distance between sound capture device 102 and drumhead 116 may be adjusted to increase the signal-to-noise ratio.

The suspension system(s) described herein allow sound capture device 102, inclusive of the transducer assembly 702, to be suspended within musical instrument 106 so that vigorous shaking of musical instrument 106 does not generate unwanted audio artifacts from sound capture device 102 contacting any of the various surfaces described. That is, sound capture device 102 is suspended from universal mounting assembly 212 so as to prevent contact between sound captured device 102 and inner surface 202 of shell 114. Similarly, the transducer assembly 702 is suspended within the frame structure of sound capture device 102 so as to prevent the transducer assembly 702 from contacting the components of the frame structure of sound capture device 102 and/or the shielding 502.

The example implementations described herein provide improved isolation in terms of detection of other sound sources. As an illustrative and non-limiting example, two hand drums may be placed next to, or adjacent to, one another. Within the first of the hand drums, sound capture device 102 is suspended therein substantially as described herein. For purposes of comparison, a conventional microphone may be located external to the first hand drum such that a strike to the first hand drum results in each of sound capture device 102 and the conventional microphone generating substantially equivalent amplitudes in the resulting audio signal. If the second hand drum is struck, the amplitude of the strike to the second hand drum, as detected by sound capture device 102 in the first hand drum, is lower or reduced compared to the amplitude of the strike to the second hand drum as detected by the conventional microphone.

In scenarios where the conventional microphone is disposed inside of the first hand drum, the isolation performance of the conventional microphone tends to become worse than when placed external to the first hand drum and pointing to the drumhead of the first hand drum. That is, the amplitude of the signal from a strike of the second hand drum, as detected by a conventional microphone mounted within the first hand drum is larger than the amplitude of the signal from a strike of the second hand drum when the conventional microphone is mounted external to the first hand drum as previously described.

The vertical positioning of sound capture device 102 within musical instrument 106 influences the performance of sound capture device 102 in terms of the detection of sympathetic resonance within the resulting audio signal. That is, the closer sound capture device 102 is to drumhead 116, the more sound capture device 102 detects sympathetic resonance and the greater the presence of sympathetic resonance in the resulting audio signal. The farther sound capture device 102 from drumhead 116, the less sound capture device 102 is able to detect sympathetic resonance such that sympathetic resonance has a lesser presence in the resulting audio signal.

It should be appreciated that certain percussion instruments, e.g., congas, have a natural sympathetic resonance that occurs by virtue of acoustics between the drums. For example, given a pair of hand drums placed adjacent to one another, if the first hand drum is struck, one will hear the fundamental of the first hand drum when placing one's ear next to the second hand drum. The inventive arrangements described herein are not intended to mitigate and/or eliminate all such naturally occurring sympathetic resonances and can be configured to capture the same amount of naturally occurring sympathetic resonance as compared to an external microphone.

The horizontal positioning of sound capture device 102 within musical instrument 106 may be determined by a variety of factors. One factor is that the transducers within sound capture device 102 are preferably offset from a center of drumhead 116 to accurately represent the timbre of musical instrument 106. Another factor is that the offset preferably is set to leave sufficient space between sound capture device 102 and the inner surface 202 of the shell 114 of musical instrument 106. Sufficient space ensures that sound capture device 102 does not contact the inner surface 202 of shell 114 during rigorous performance or in transport.

Figure 12A:
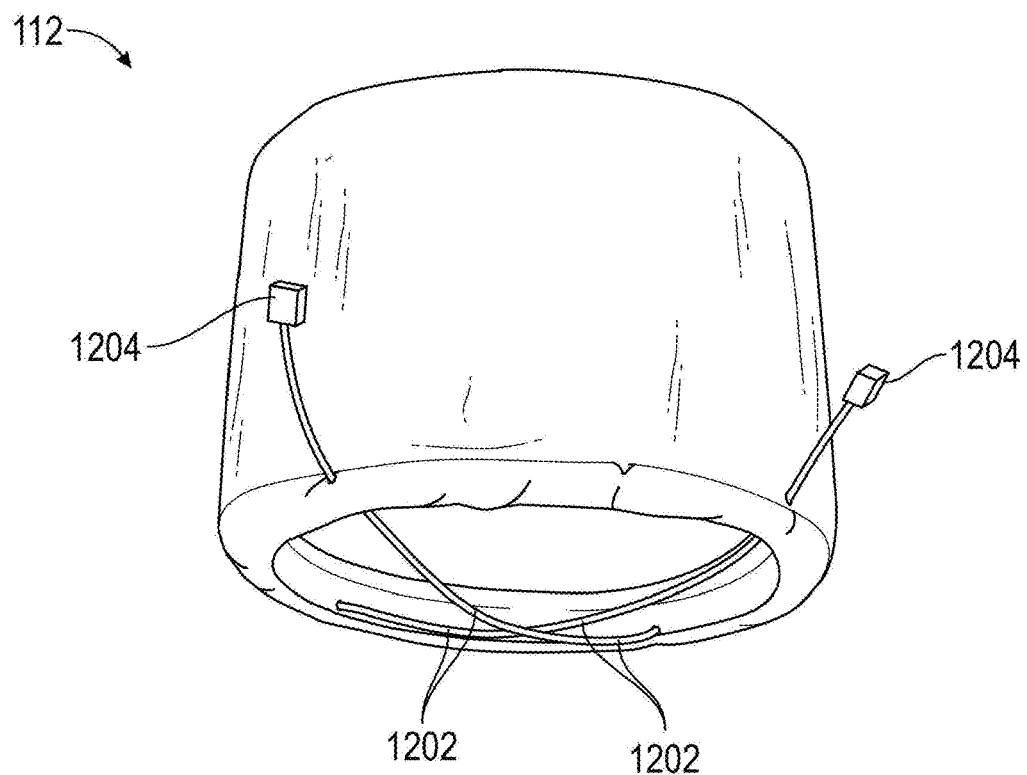
FIGS. 12A and 12B illustrate example diffusors.
Figure 12B:
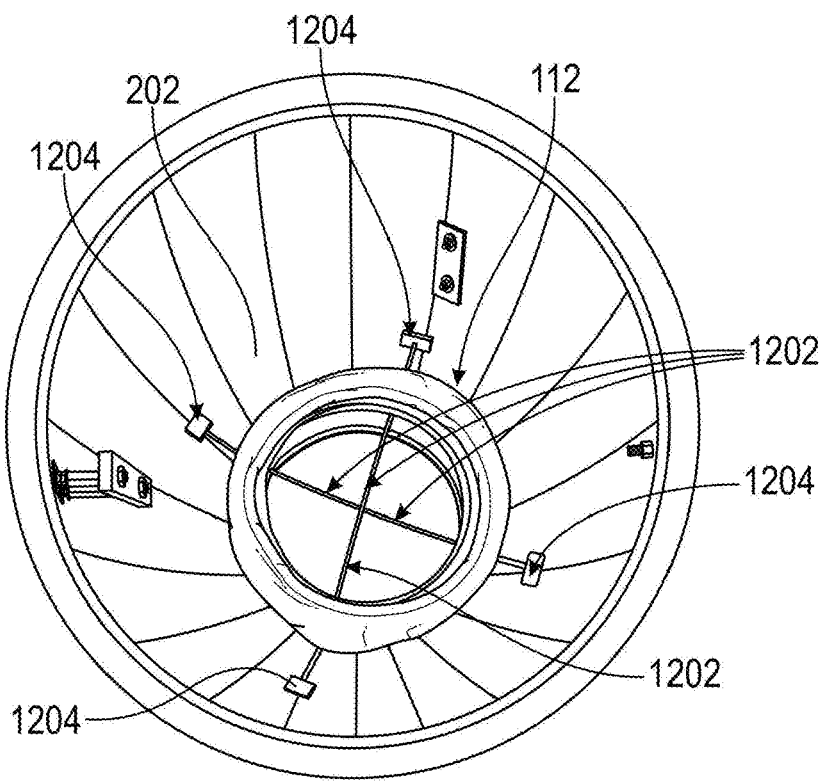

FIGS. 12A and 12B illustrate examples of diffusor 112. In the example of FIG. 12A, diffusor 112 has a body portion implemented as a hollow cylindrical structure. Diffusor 112 is shown removed from musical instrument 106 for purposes of illustration. Diffusor 112 may be held in place within musical instrument 106 using prongs 1202, where the end of each prong 1202 may have a foot 1204. The feet 1204 may be implemented using rubber or neoprene foot, for example. In the example of FIG. 12A, the body portion of diffusor 112 is not tapered, though in other example implementations, the body portion of diffusor 112 may be tapered toward the top while in still other example implementations the body portion of diffusor 112 may be tapered toward the bottom.

FIG. 12B illustrates diffusor 112 positioned within musical instrument 106. The view of FIG. 12B shows musical instrument 106 with drumhead 116 being removed and without sound capture device 102 suspended therein to provide a clear view of diffusor 112.

Though diffusor 112 is described as being held in place using prongs 1202 and feet 1204, in other examples, diffusor 112 may be held in position within musical instrument 106 by suspending diffusor within musical instrument 106. In another example, diffusor 112 may be suspended using plastic rods or another mechanism that provides acoustic isolation and does not rattle (e.g., is not susceptible to physical vibration or shaking of musical instrument 106).

Figure 13:
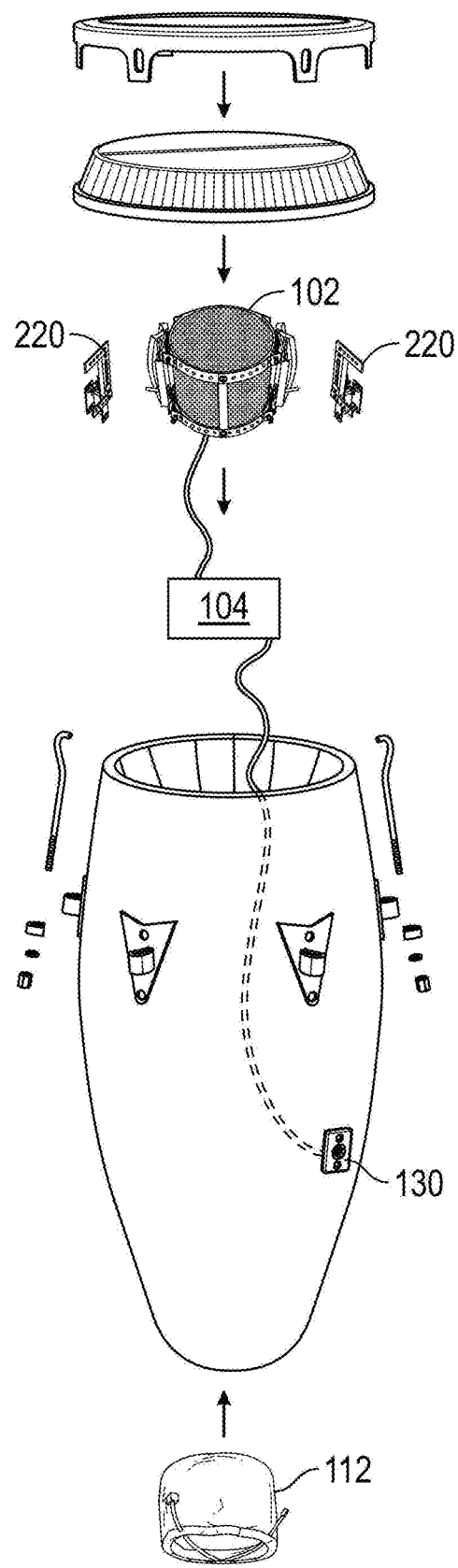
FIG. 13 illustrates an exploded view of an example sound capture system and musical instrument.

FIG. 13 illustrates an exploded view of sound capture system 100 and musical instrument 106. In the example, sound capture system 100 is shown including sound capture device 102, signal processing circuit 104, and diffusor 112. Audio connector 130 is also shown along with C-mount 220 and the universal mounting assembly 212. In the example of FIG. 13, it should be appreciated that the diffusor 112 may be installed from the top of the musical instrument and is illustrated below for purposes of illustration.

Figure 14:
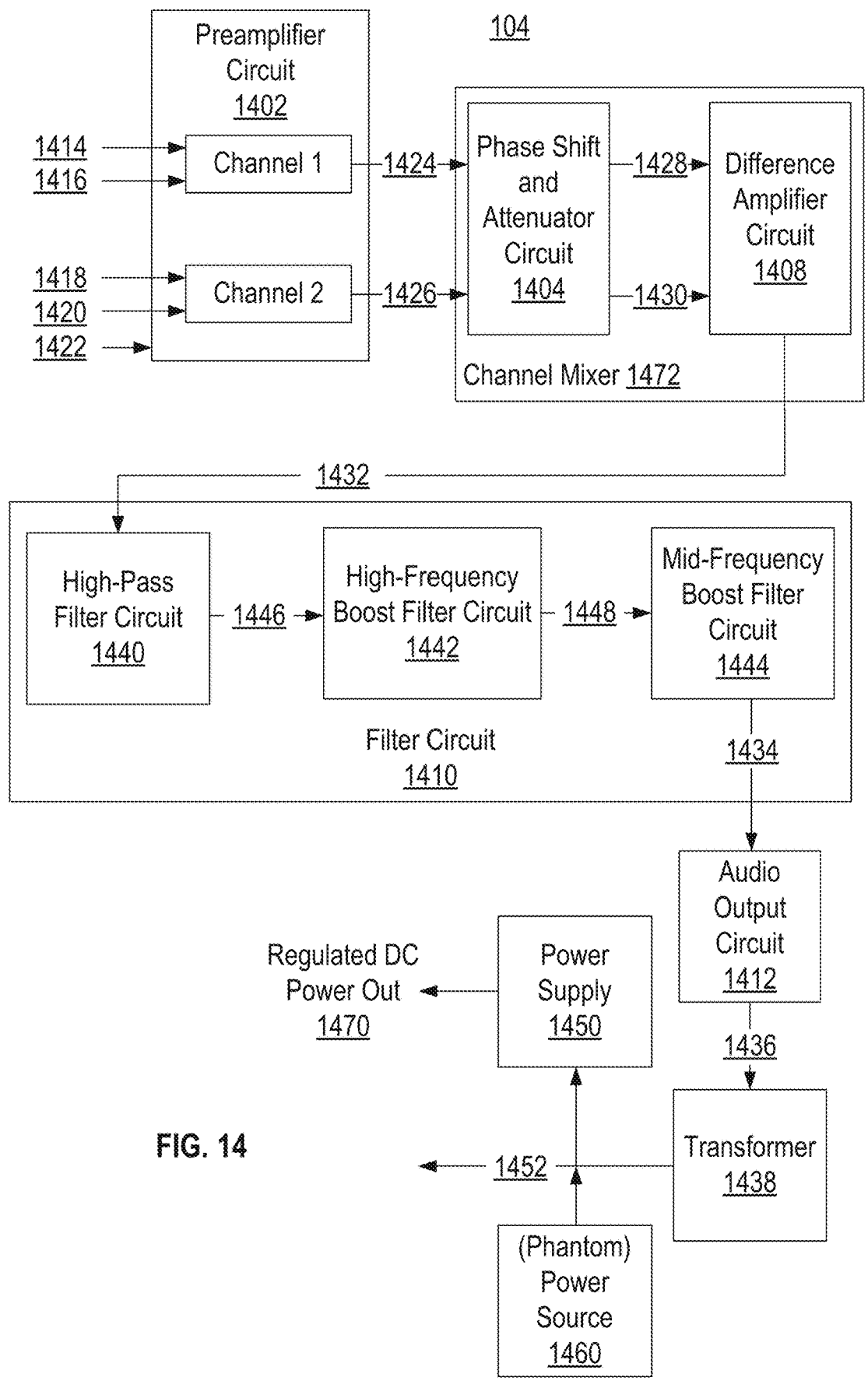
FIG. 14 illustrates an example signal processing circuit.

FIG. 14 illustrates an example circuit architecture for signal processing circuit 104. In the example of FIG. 14, signal processing circuit 104 includes a preamplifier circuit 1402, a channel mixer 1472, a filter circuit 1410, an audio output circuit 1412, a transformer 1438, and a power supply 1450. The various circuit blocks illustrated in FIG. 14 are capable of processing signals, as described, in real time. In the example of FIG. 14, the phantom power source 1460 represents an external device capable of supplying phantom power. That is, phantom power source 1460 is shown for purposes of illustration but is not part of signal processing circuit 104. For example, phantom power source 1460 may be a console into which signal processing circuit 104 is connected.

Preamplifier circuit 1402 may be implemented as a two-channel preamplifier. Each channel, shown as channels 1 and 2, of preamplifier circuit 1402 receives the signals generated by one of the two transducers 804 of sound capture device 102. For example, channel 1 receives positive signal 1414 and negative signal 1416 from the transducer 804 that is rotated to a position closest to drumhead 116. Channel 2 of preamplifier circuit 1402 receives the positive signal 1418 and the negative signal 1420 from transducer 804 that is rotated to a position that is farthest from drumhead 116. A ground signal 1422 that is coupled to the shielding of sound capture device 102, e.g., shielding 502, is coupled to ground of preamplifier circuit 1402.

In one or more examples, preamplifier circuit 1402 may be implemented as a low-noise, low current, op-amp based microphone preamplifier circuit. Preamplifier circuit 1402 is capable of buffering received signals 1414, 1416, 1418, and 1420 and providing a low impedance for subsequent processing stages. Preamplifier circuit 1402 is also capable of increasing the gain of the received signals to output signals 1424, 1426 with increased levels. This can improve signal-to-noise ratio of signal processing circuit 104.

Channel 1 is capable of outputting signal 1424 to channel mixer 1472. In the example, channel mixer 1472 includes a phase shift and attenuator circuit 1404 and a difference amplifier circuit 1408. As shown, channel 1 is capable of outputting signal 1424 to phase shift and attenuator circuit 1404. Signal 1424 may be generated by summing signals 1414 and 1416. Channel 2 outputs signal 1426 to channel mixer 1472. As shown, channel 2 outputs signal 1426 to phase shift and attenuator circuit 1404. Signal 1426 may be generated by summing signals 1418 and 1420. Phase shift and attenuator circuit 1404 outputs signal 1428 to a first input of difference amplifier circuit 1408. Phase shift and attenuator circuit 1404 outputs signal 1430 to a second input of difference amplifier circuit 1408. Difference amplifier circuit 1408 outputs signal 1432 to filter circuit 1410.

Filter circuit 1410 outputs signal 1434 to audio output circuit 1412. Audio output circuit 1412 may output signal 1436 to transformer 1438. Transformer 1438 is capable of generating output signal 1452 to other systems and routing DC power to power supply 1450. Output signal 1452 may be a low impedance, balanced signal. Power supply 1450 is capable of providing one or more different voltage level power signals, generated from phantom power source 1460 (e.g., a DC component that is present on signal 1452 as provided from power source 1460) to power other components of signal processing circuit 104. For purposes of illustration, the one or more different voltage level power signals generated by power supply 1450 are illustrated as regulated DC power out 1470. Appreciably, output signal 1452 may include an AC component carrying the processed audio output from signal processing circuit 104. Output signal 1452 may be conveyed over a suitable audio connector such as an XLR connector.

Phase shift and attenuator circuit 1404 receives signal 1424 from channel 1 of preamplifier circuit 1402 and receives signal 1426 from channel 2 of preamplifier circuit 1402. In one example implementation, a phase shift portion of phase shift and attenuator circuit 1404 is implemented as a second order all pass filter. The phase shift portion of phase shift and attenuator circuit 1404 may be implemented with a center frequency denoted as $F_0$. The phase shift portion of phase shift and attenuator circuit 1404 is configured to generate signal 1428 having a center frequency $F_0$ that is substantially 180 degrees out of phase with signal 1430.

In one aspect, signal processing circuit 104, using channel mixer 1472, is operative to cancel unwanted resonances, e.g., artifacts, detected by sound capture device 102. In general, phase shift and attenuator circuit 1404 phase shifts the incoming signal 1424 so that signal 1428 includes certain desired frequencies such as the fundamental and one or more natural overtones in phase with the same frequencies of signal 1430. Certain other frequencies that are undesirable are phase-shifted to be out of phase with the same undesirable frequencies of signal 1430 thereby canceling each other out by operation of difference amplifier circuit 1408. Thus, signal 1432 includes the desirable frequencies from musical instrument 106 such as the fundamental and one or more natural overtones while other undesirable frequencies are removed.

In an example implementation, phase shift and attenuator circuit 1404 is operable to phase shift frequencies approximately 180° out of phase from the incoming signal in the range of approximately 600-800 Hz. The frequency range of 600-800 Hz is characteristic of the unwanted resonances captured by sound capture device 102. The center frequency $F_0$ may be considered a problem frequency with respect to musical instrument 106 in that the center frequency $F_0$ may be the dominant standing wave frequency that occurs inside musical instrument 106. In cases where musical instrument 106 is tubular in shape, for example, the standing wave is analogous to a room mode given the dimensions of the musical instrument.

In one or more embodiments, the center frequency $F_0$ of the phase shift portion of phase shift and attenuator circuit 1404 may be set at approximately 700 Hz. Appreciably, the frequency of signal 1428 at the center frequency of the phase shift portion of phase shift and attenuator circuit 1404 is shifted 180° from the that of incoming signal 1424. Frequencies above and below the center frequency in signal 1428 become increasingly in phase with the corresponding frequencies of signal 1424 with increasing distance from the center frequency $F_0$.

Figure 15:
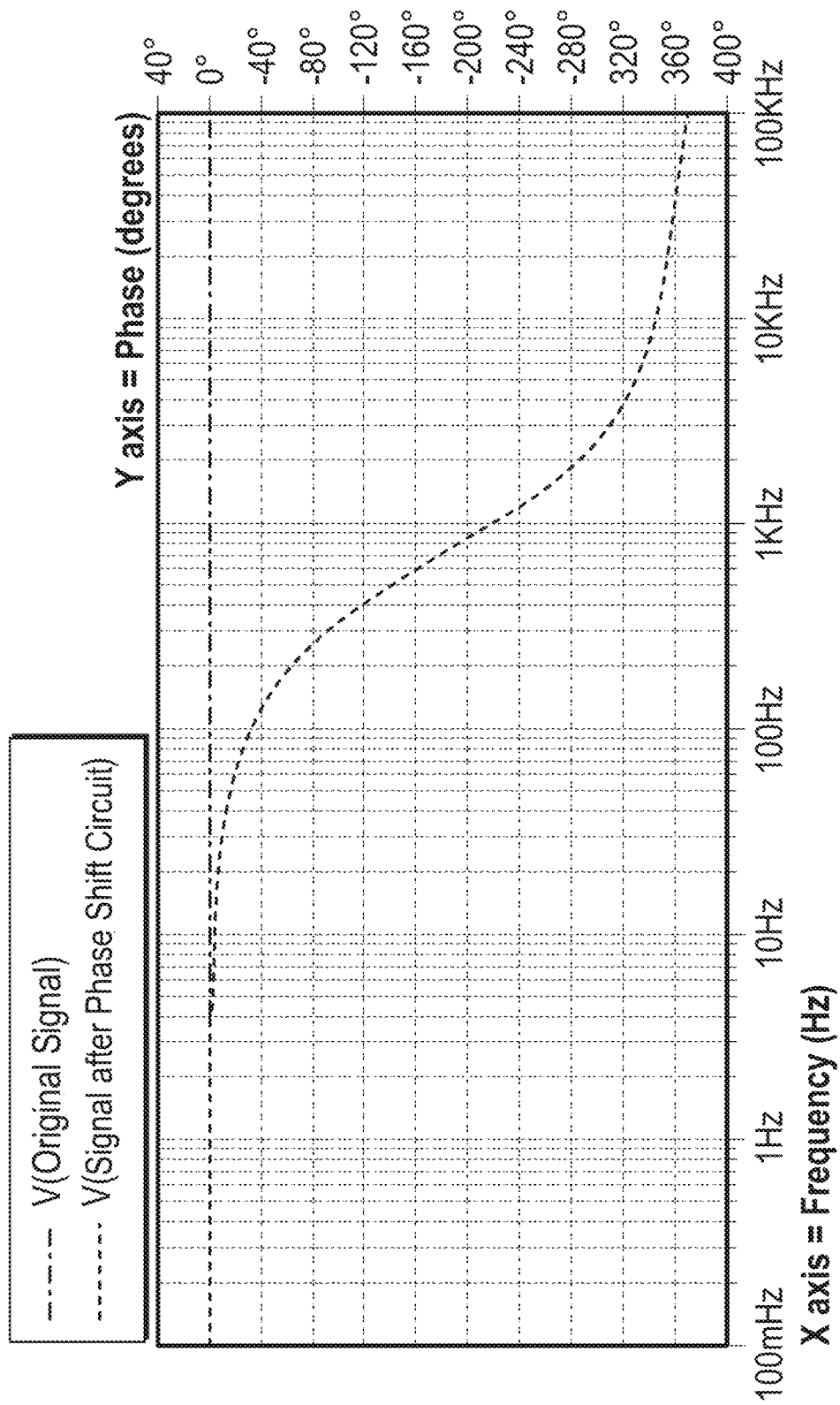
FIG. 15 is a graph illustrating an example of a phase curve applied by a phase shift portion of a phase shift and attenuator circuit of the signal processing circuit.

FIG. 15 is a graph illustrating an example of the phase curve applied by the phase shift portion of phase shift and attenuator circuit 1404.

In one aspect, phase shift and attenuator circuit 1404 include an attenuator portion. In an example implementation, the attenuator portion may be implemented as an active attenuator. The attenuator portion of phase shift and attenuator circuit 1404 is configured to match the levels of signals 1428 and 1430 so that both signals 1428 and 1430 have the same or substantially the same RMS (root-mean-square) voltage prior to entering difference amplifier circuit 1408. That is, the attenuator portion of phase shift and attenuator circuit 1404 is operable to modify levels of one or both of signals 1428 and 1430 so that the two signals have substantially matching signal levels.

In matching levels of signals 1428, 1430, it should be appreciated that the attenuator portion of phase shift and attenuator circuit 1404 may be operable on signal 1428, or signal 1430, or on both signals 1428, 1430. Further, the attenuator portion of phase shift and attenuator circuit 1404 may adjust levels of one or both of such signals by increasing the level of one or both signals 1428, 1430, decreasing the level of one or both signals 1428, 1430, or increasing the level of one signal while decreasing the level of the other signal. Further, it should be appreciated that the attenuator portion of phase shift and attenuator circuit 1404 may increase (decrease) the level of signals 1428 by a first amount and increase (decrease) the level of signal 1430 by a different amount than used to adjust signal 1430.

Difference amplifier circuit 1408 receives signals 1428 and 1430, which are matched in terms of amplitude post processing by phase shift and attenuator circuit 1404. Signal 1428 may be provided to the non-inverting input difference amplifier circuit 1408, while signal 1430 may be provided to the inverting input of difference amplifier circuit 1408. Signal 1432, as output by difference amplifier circuit 1408, mitigates the unwanted problem frequency, or unwanted interior resonances, previously discussed. That is, the amplitude of the unwanted interior resonances are reduced and/or removed through operation of the difference amplifier circuit 1408 using phase cancelation.

Figure 16:
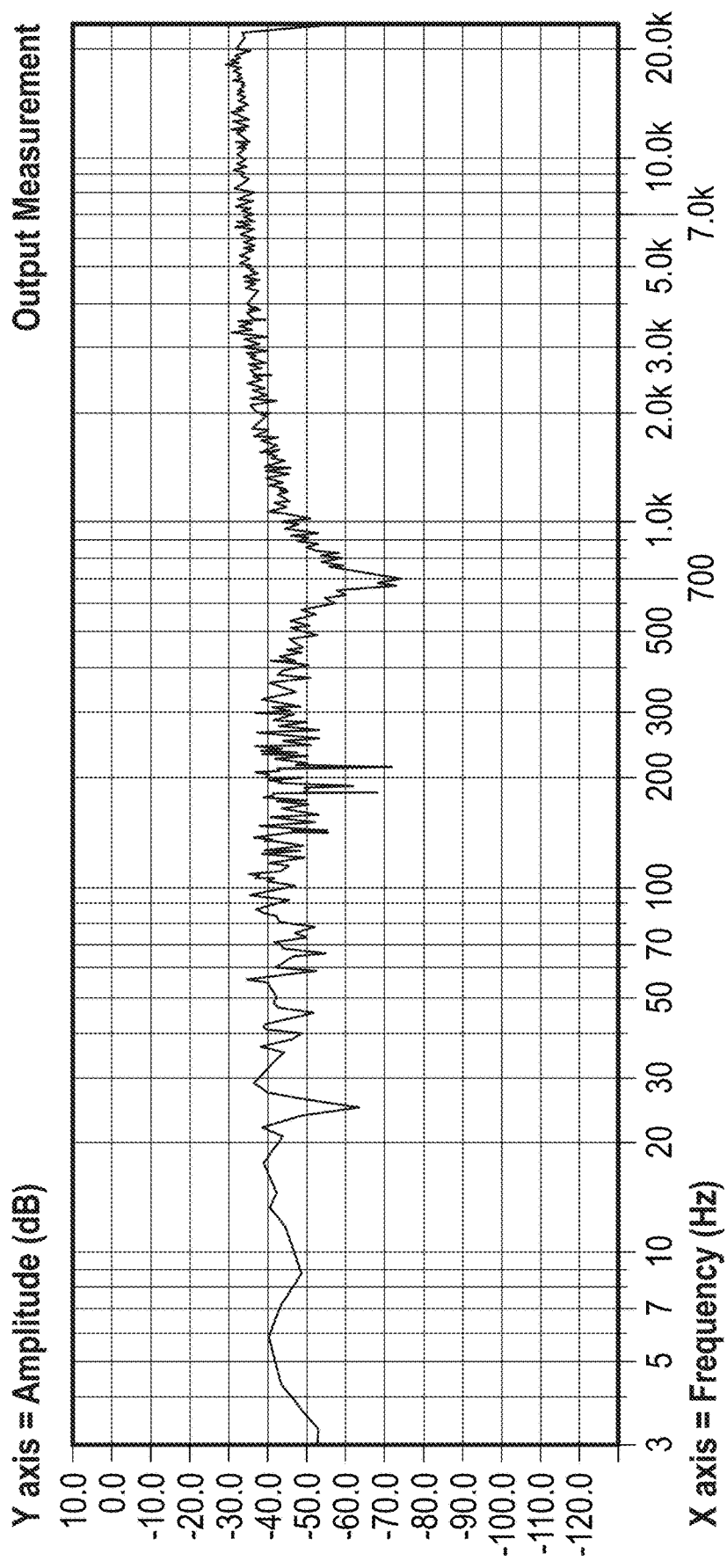
FIG. 16 is a graph illustrating an example of a notched frequency around a center frequency that may be generated by the signal processing circuit.

FIG. 16 is a graph illustrating an example of the notched frequency around the center frequency that may be generated by difference amplifier circuit 1408 (e.g., in signal 1432). The center frequency is 700 Hz. The graph illustrates a diminished signal level around the center frequency. The graph of FIG. 16 is created using two identical white noise signals as signals 1424 and 1426.

Figure 17:
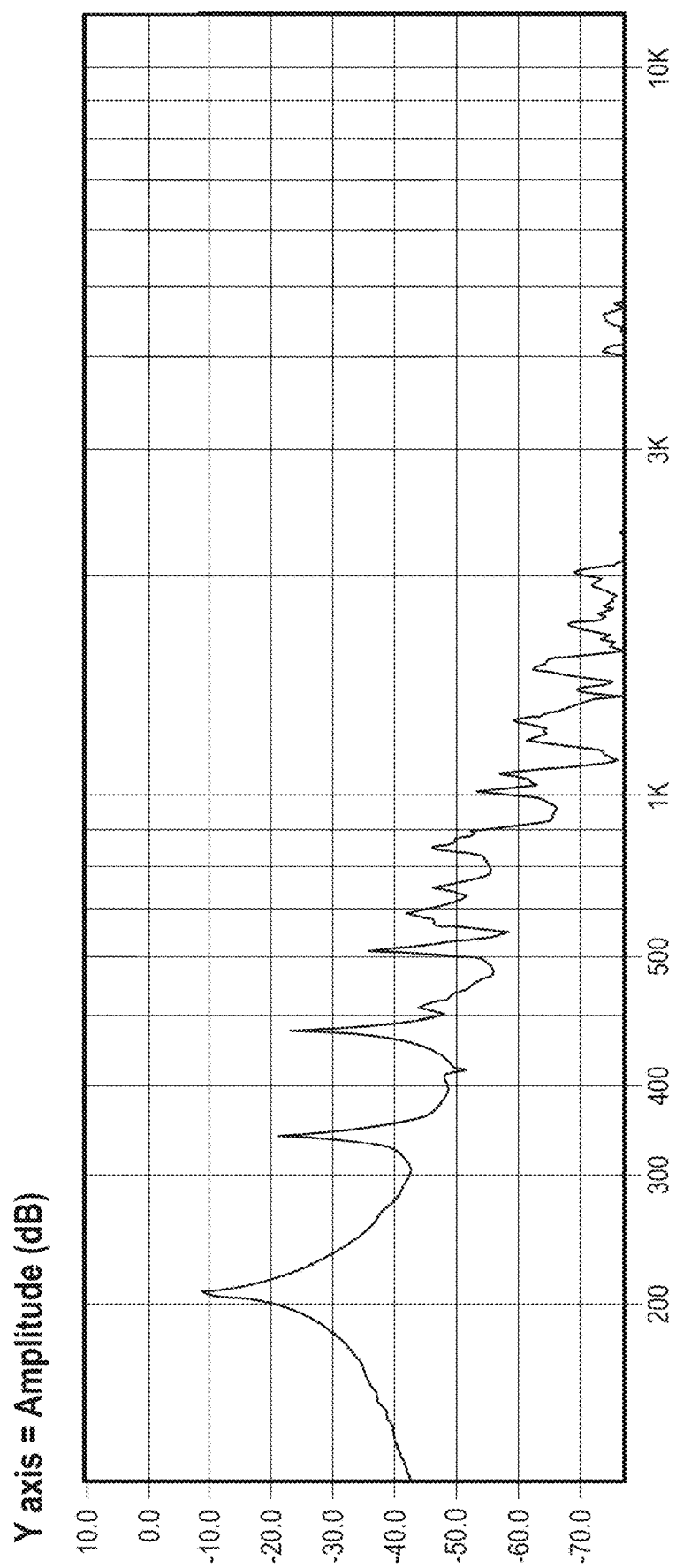
FIG. 17 illustrates an example spectrum analysis of the sound of a tumba conga drum as captured by a conventional microphone located external to the drum.

FIG. 17 illustrates an example of a spectrum analysis of the sound generated by a tumba conga drum as captured by a conventional microphone located external to the drum. For purposes of reference, the spectrum analysis of FIG. 17 is captured by a Sennheiser MD-421.

Figure 18:
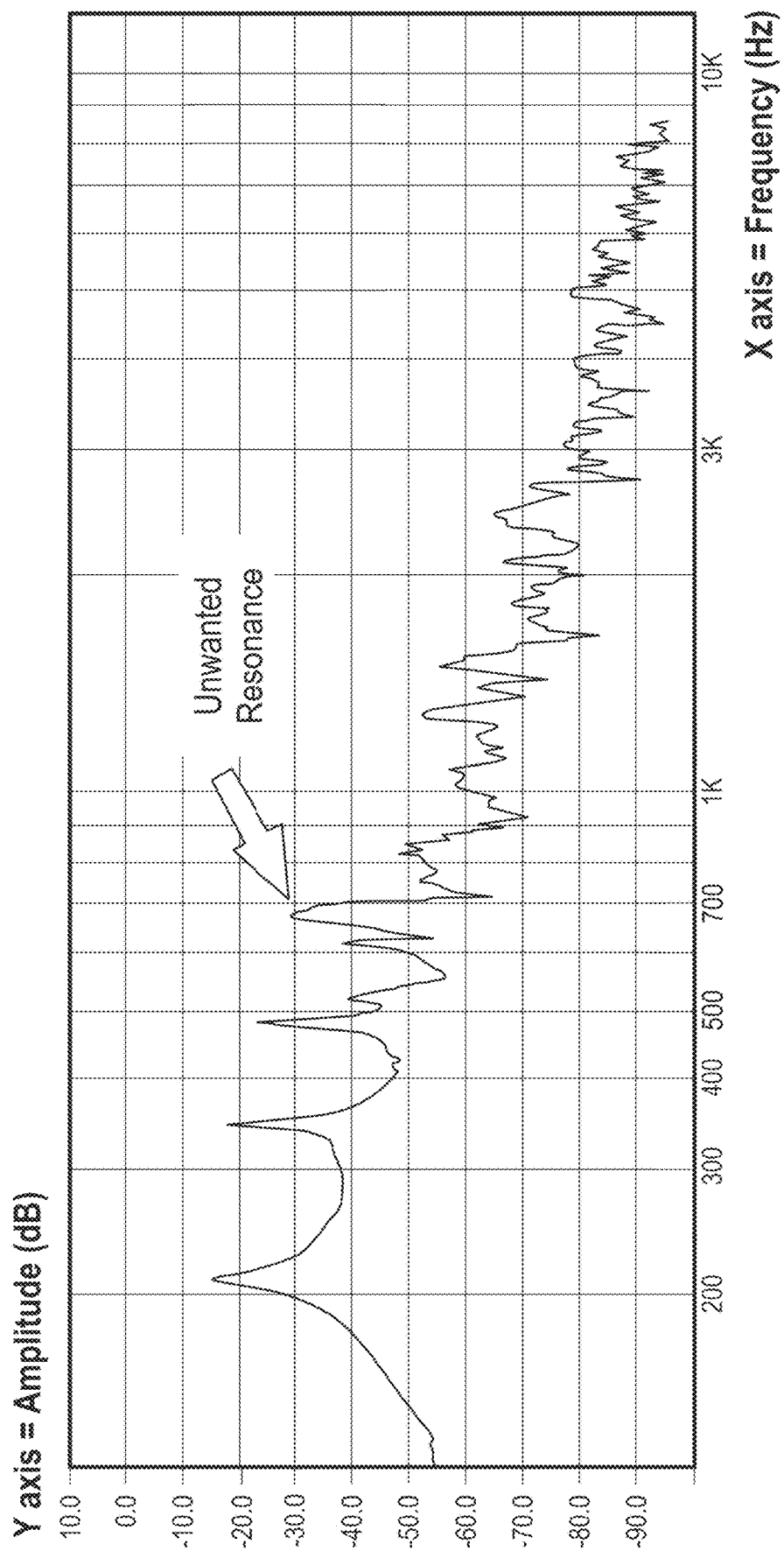
FIG. 18 illustrates an example spectrum analysis of the sound of a tumba conga drum as captured by a single transducer.

FIG. 18 illustrates an example of a spectrum analysis of signal 1436, as output from audio output circuit 1412, representing the sound generated by the tumba conga drum using only a single transducer 804. For example, only the top transducer 804 may be used as provided to channel 1 of preamplifier circuit 1402 without phase shifting or use of difference amplifier circuit 1408. As illustrated, the spectrum analysis includes an unwanted resonance at approximately 700 Hz.

Figure 19:
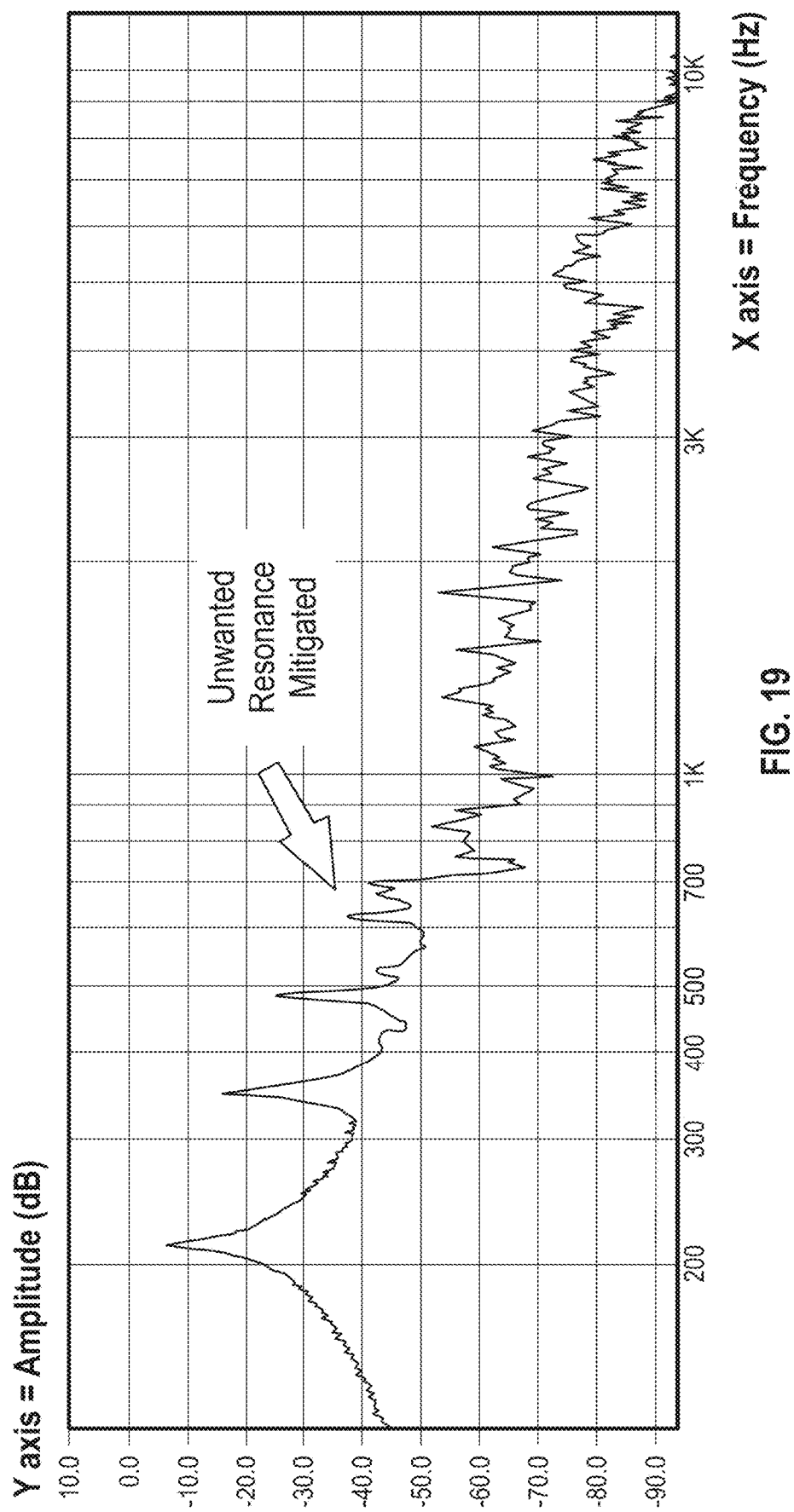
FIG. 19 illustrates an example spectrum analysis of a signal as output from the sound capture system in accordance with the inventive arrangements.

FIG. 19 illustrates an example of a spectrum analysis of signal 1436, as output from audio output circuit 1412, representing the sound generated by the tumba conga drum using both transducers 804, phase shift and attenuator circuit 1404, and difference amplifier circuit 1408 for processing. FIG. 19 illustrates that the unwanted resonance is mitigated thereby resulting in a more natural sound of the musical instrument as conveyed by signal 1436. Thus, summing signal 1428 with signal 1430 by way of difference amplifier 1408 results in signal 1432 having a significant notch, e.g., reduction in amplitude, at the center frequency $F_0$ of phase shift circuit 1404.

The signal processing technique illustrated in FIG. 14 provides another benefit with respect to interior resonances. The processing described through preamplifier circuit 1402, phase shift and attenuator circuit 1404, and difference amplifier circuit 1408 is capable of mitigating unwanted frequencies in the range of approximately 600-800 Hz thereby effectively canceling the unwanted interior resonances. Because differently sized musical instruments (e.g., stretched membrane percussion instruments) within a same family of musical instruments will have different interior resonance frequencies (e.g., standing waves) within this range, the techniques illustrated and described in connection with FIG. 14 are capable of attenuating and/or eliminating these unwanted interior resonances across differently sized stretched membrane musical instruments of a same family without further modification of the signal processing circuit 104. This makes the circuit architecture illustrated in FIG. 14 suitable for use across a variety of differently sized stretched membrane percussion instruments within a same family of stretched membrane percussion instrument (e.g., from one size conga drum to another).

In addition, the unwanted frequenc(ies) to be notched for a given stretched membrane percussion instrument may change with the particular tuning of musical instrument 106. The inventive arrangements described herein are operable to remove unwanted interior resonances for differently tuned percussion instruments.

The circuit architecture described in connection with FIG. 14 is capable of attenuating and/or removing the unwanted resonance in the frequency range without affecting or substantially affecting the natural overtones of musical instrument 106 while also preserving the timbre and character of musical instrument 106. The techniques described within this disclosure are capable of operating in an adaptive manner that automatically adapts to remove the unwanted interior resonance despite the particular frequency of the standing wave varying from one size stretched membrane percussion instrument to another and/or tuning of the stretched membrane percussion instrument so long as the unwanted resonance is within the defined frequency range.

Otherwise, were an equalization notch filter to be used in place of the circuit architecture of FIG. 14, an analysis of each differently sized stretched membrane percussion instrument would be necessary in order to configure or tune the equalization notch filter for attenuation of the desired frequencies within each respective musical instrument. Further, the equalization notch filter, despite tuning for each differently sized instrument within a given family, does affect or substantially affect the natural overtones, timbre, and character of musical instrument 106.

Filter circuit 1410 may be included to boost and/or cut one or more frequency ranges in the signal output from difference amplifier circuit 1408. In the example of FIG. 14, the constituent filters of filter circuit 1410 are connected in serial. Filter circuit 1410 may include high-pass filter circuit 1440, high-frequency boost filter circuit 1442, and mid-frequency boost filter circuit 1444.

High pass filter circuit 1440 may be included to reduce low frequency rumble, e.g., low frequency artifacts at or about 80 Hz and below, in the signal. High-pass filter circuit 1440 generates signal 1446, which is provided as an input to high-frequency boost filter circuit 1442. In one or more example implementations, high-pass filter circuit 1440 is optional and may be omitted from filter circuit 1410.

High-frequency boost filter circuit 1442 is operative to increase the signal-to-noise ratio in the higher frequencies of the audible spectrum. In an example implementation, the high-frequency boost filter circuit 1442 is operable to increase or accentuate frequencies in the range of approximately 3 kHz to 10 kHz. High-frequency boost filter circuit 1442 is capable of adding gain to the noted frequency range prior to the signal generated from sound capture system 100 being processed further through other active circuits such as a mixing console. Adding gain to the noted frequency range earlier in the signal chain may help to reduce high frequency hiss that is often added by further active circuits attempting to increase this frequency range later in the signal chain.

For example, sound engineers often increase this frequency range for percussion instruments to accentuate the attack. By boosting such frequencies earlier in the signal chain, the amount of high frequency hiss or noise added to the signal from further boosting the 3 kHz to 10 kHz frequency range later in the signal chain may be reduced. High-frequency boost filter circuit 1442 generates signal 1448, which is provided to mid-frequency boost filter circuit 1444 as an input.

Mid-frequency boost filter circuit 1444 is capable of boosting or increasing the frequencies in the range of $F_0$ as operated on by phase shift circuit 1404. The mid-frequency boost filter circuit 1444 may be used to compensate for cases where the frequency $F_0$ is reduced more than desired by difference amplifier circuit 1408. Mid-frequency boost filter circuit 1444 generates signal 1434, which may be provided to audio output circuit 1412.

Audio output circuit 1412 receives signal 1434 post filtering by filter circuit 1410. Audio output circuit 1412 is capable of outputting signal 1436 as a microphone level signal as is generated and output from any of a variety of standard passive dynamic microphones. Examples of passive dynamic microphones include, but are not limited to, Shure SM57, Sennheiser MD-421 as are commonly used with percussion instruments.

Audio output circuit 1412 generates signal 1436, which is provided to transformer 1438 as an input. Transformer 1438 generates signal 1452. Transformer 1438 is capable of providing the low impedance characteristics of a dynamic microphone output. Transformer 1438 and other active stages of signal processing circuit 104 are designed to match the voltage (gain) levels of a "mic level" device. Transformer 1438 further helps isolate the DC component from phantom power source 1460 and prevent the DC component from entering the AC signal path that performs the AC real-time processing. Transformer 1438 is capable of directing the DC component to power supply 1450.

Use of the transformer 1438 also helps to maintain low current and low noise circuit performance. Other circuit architectures, e.g., an active (e.g., op-amp) output stage driving a low impedance load with low noise, would generally require more current than is available from phantom power source 1460.

In one aspect, signal 1452 includes the processed audio as the AC component. The DC component provided by phantom power source 1460 can be provided to power supply 1450. As noted, power supply 1450 is capable of providing one or more different voltage level power signals shown as regulated DC power out 1470 to power the other components of signal processing circuit 104.

In the examples, the signal path through signal processing circuit 104 consumes little power and utilizes low noise audio op-amps to perform the functions performed by preamplifier circuit 1402, phase shift circuit 1404, channel mixer and attenuator circuit 1406, difference amplifier circuit 1408, and filter circuit 1410. These stages may also operate at 48-volts. Transformer 1438 therein, is capable of attenuating the signal down to "microphone level." For example, transformer 1438 is capable of stepping down the output level (e.g., voltage) of signal 1436 to that of a microphone level signal and also lowers the output impedance of the signal processing circuit 104. Transformer 1438 is also capable of isolating output from certain components such as op-amps from the DC component provided from phantom power source 1460 and reducing the load on the op-amps.

In the example of FIG. 14, the 48-volt phantom power is used to power signal processing circuit 104 and not for operation of sound capture device 102. In one or more example implementations, regulated DC power output 1470 may be provided to active components included in signal processing circuit 104. The active components may include preamplifier circuit 1402, phase shift circuit 1404, channel mixer and attenuator circuit 1406, and/or difference amplifier circuit 1408. The inventive arrangements allow signal processing circuit 104 to be powered by phantom power source 1460 thereby negating the need for another independent power source.

In one or more other arrangements, however, power supply 1450 may obtain power from another source such as an external AC power adapter (e.g., wall wart power supply), battery source, or the like. In that case, use of phantom power is not necessary.

Figure 20:
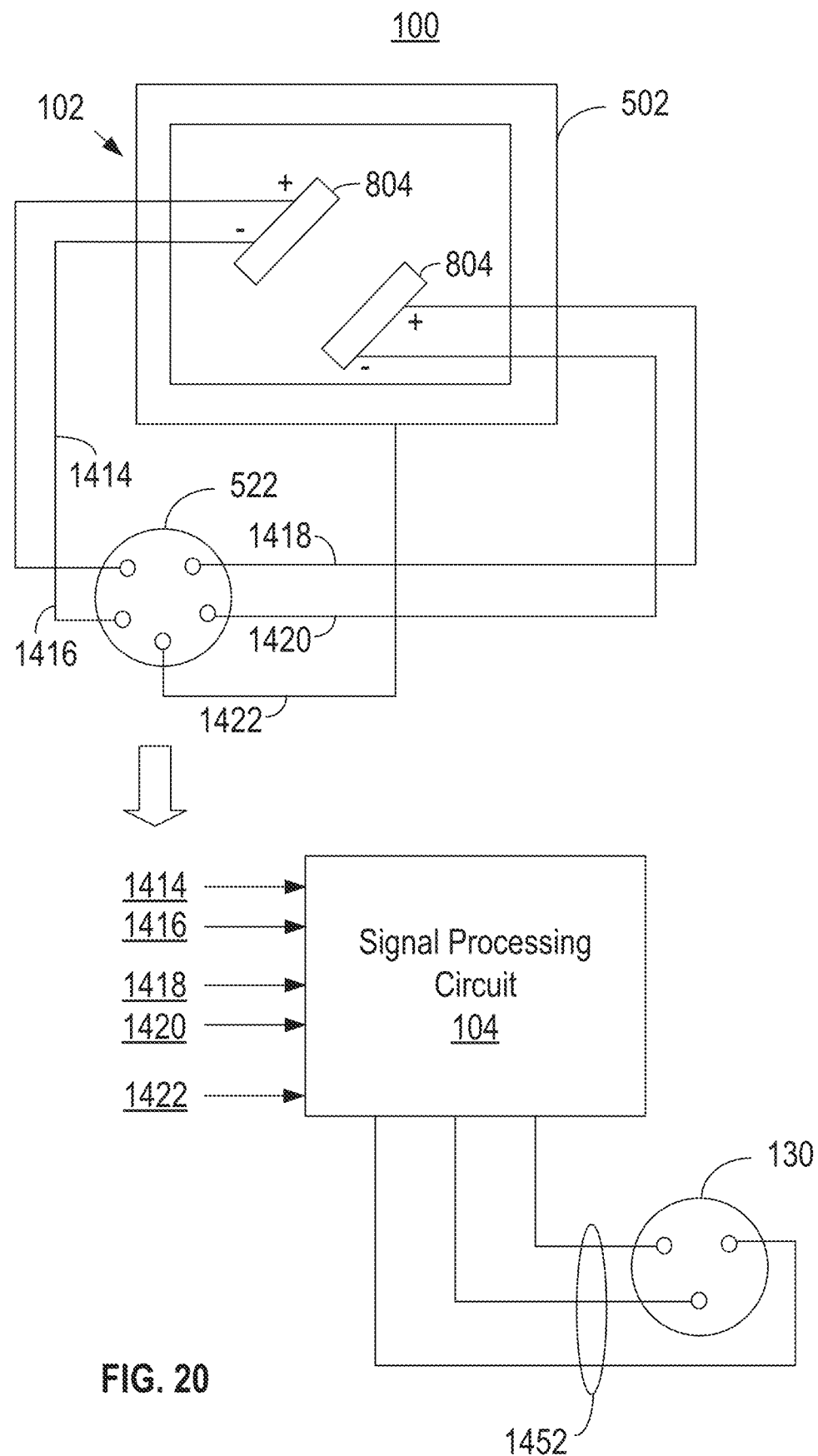
FIG. 20 is a block diagram illustrating an example of the connectivity between the sound capture device and the signal processing circuit.

FIG. 20 is a block diagram illustrating an example of the connectivity between sound capture device 102 and the signal processing circuit 104. In the example, the transducers 804 are coupled to signal processing circuit 104 by way of multi-pin connector 522. Multi-pin connector 522 is implemented as a 5-pin connector in the example. The output from signal processing circuit 104 may be provided to other devices by way of audio connector 130. Audio connector 130 may be a 3-pin female XLR connector providing signal 1452 (e.g., as ground, positive, and negative signals or shield, hot, and cold signals, respectively).

Figure 21:
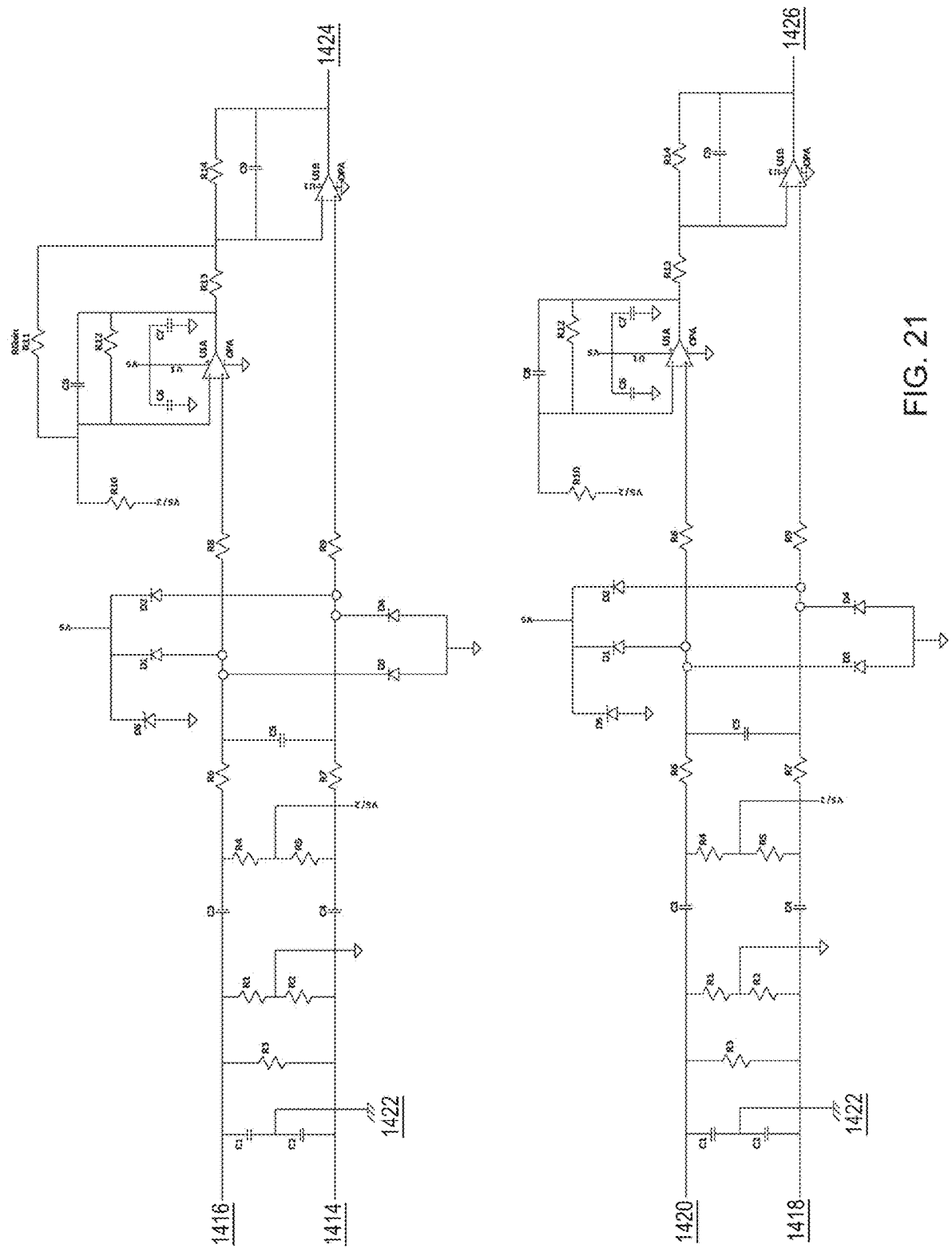
FIG. 21 is a circuit diagram illustrating an example preamplifier circuit of the signal processing circuit.

FIG. 21 is a circuit diagram illustrating an example implementation of the preamplifier circuit 1402. In one or more example implementations, the circuit components for channels 1 and 2 of the preamplifier circuitry may be specified as follows.

C1: 220 pF
C2: 220 pF
C3: 1 uF
C4: 1 uF
C5: 100 pF
C6: 0.1 uF
C7: 1 uF
C8: 22 pF
C9: 22 pF
R1: 100 kΩ
R2: 100 kΩ
R3: 6.81 kΩ
R4: 20 kΩ
R5: 20 kΩ
R6: 75 Ω
R7: 75 Ω
R8: 28 Ω
R9: 28 Ω
R10: 10 kΩ
R11: 10 kΩ
R12: 10 kΩ
R13: 10 kΩ

Figure 22:
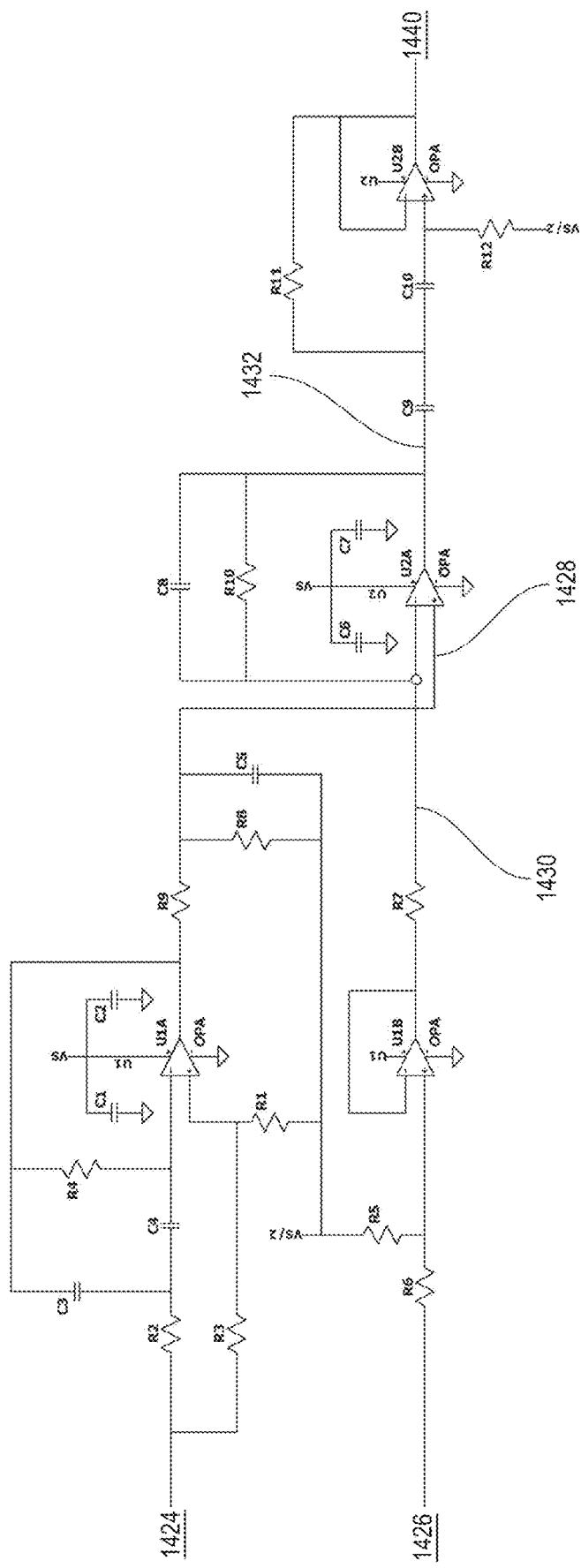
FIG. 22 is a circuit diagram illustrating examples of a phase shift and attenuator circuit, a difference amplifier circuit, and a high-pass filter described in connection with FIG. 14.

FIG. 22 is a circuit diagram illustrating an example implementation of phase shift and attenuator circuit 1404, difference amplifier circuit 1408, and the high-pass filter circuit 1440. The signal reference numbers illustrate the demarcation between the respective circuit blocks. In one or more example implementations, the circuit components of the example of FIG. 22 may be specified as follows.

C1: 0.1 uF
C2: 1 uF
C3: 0.015 uF
C4: 0.015 uF
C5: 22 pF
C6: 0.1 uF
C7: 1 uF
C8: 22 pF
C9: 0.47 uF
C10: 0.47 uF
R1: 3.83 kΩ
R2: 15 kΩ
R3: 15 kΩ
R4: 15 kΩ
R5: 3.83 kΩ
R6: 5.62 kΩ
R7: 10 kΩ
R8: 10 kΩ
R9: 10 kΩ
R10: kΩ
R11: 8.25 kΩ
R12: 15.8 kΩ

Figure 23:
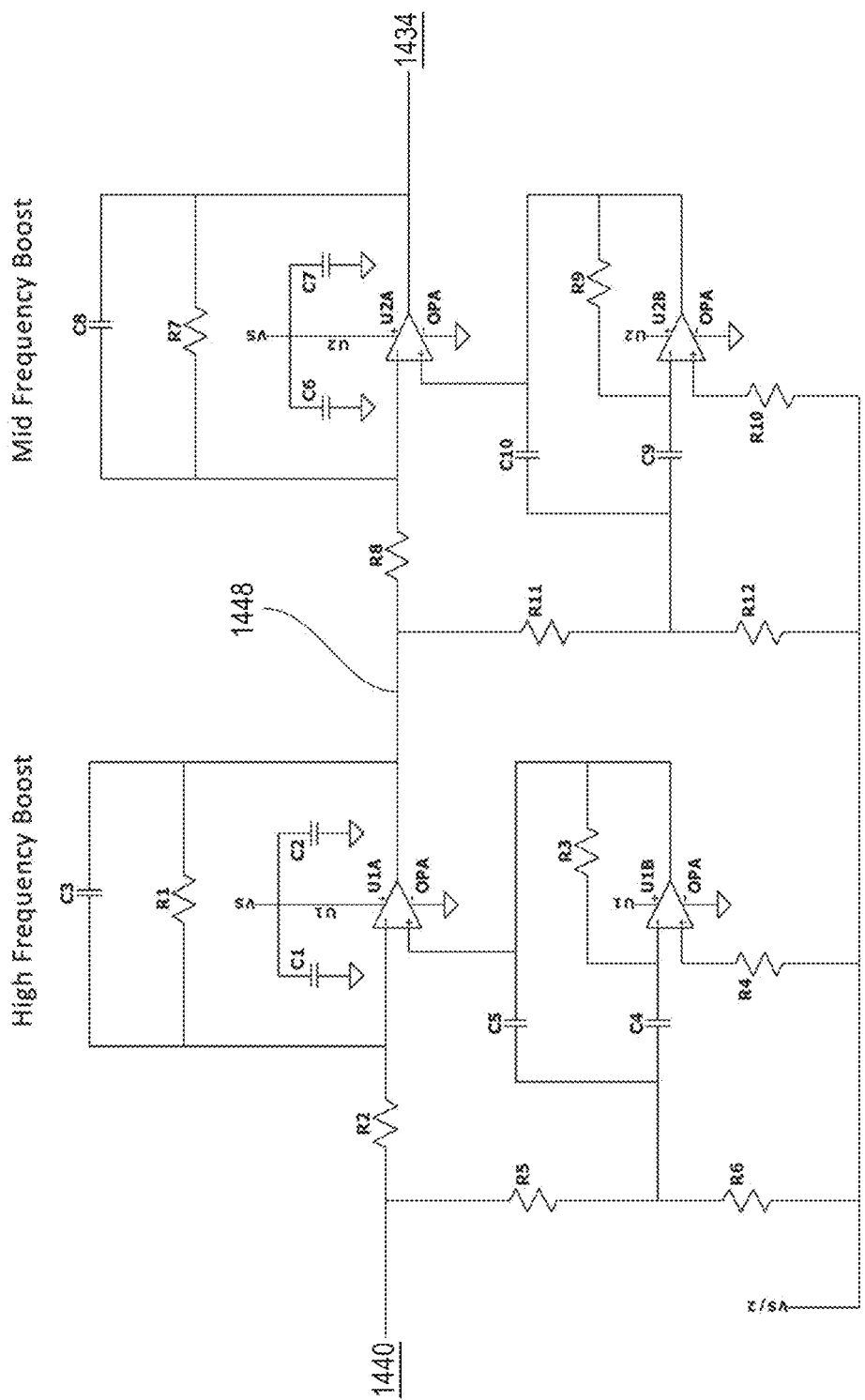
FIG. 23 is a circuit diagram illustrating examples of a high-frequency boost filter and a mid-frequency boost filter described in connection with FIG. 14.

FIG. 23 is a circuit diagram illustrating an example implementation of the high-frequency boost filter circuit 1442 and the mid-frequency boost filter circuit 1444. In one or more example implementations, the circuit components for the example of FIG. 23 may be specified as follows.

R1: 10 kΩ
R2: 10 kΩ
R3: 11.5 kΩ
R4: 11.5 kΩ
R5: 5.76 kΩ
R6: 3.09 kΩ
R7: 10 kΩ
R8: 10 kΩ
R9: 7.15 kΩ
R10: 7.15 kΩ
R11: 4.87 kΩ
R12: 9.09 kΩ
C1: 0.1 uF
C2: 1 uF
C3: 22 pF
C4: 0.0047 uF
C5: 0.0047 uF
C6: 0.1 uF
C7: 1 uF
C8: 22 pF
C9 0.068 uF
C10: 0.033 uF

Figure 24:
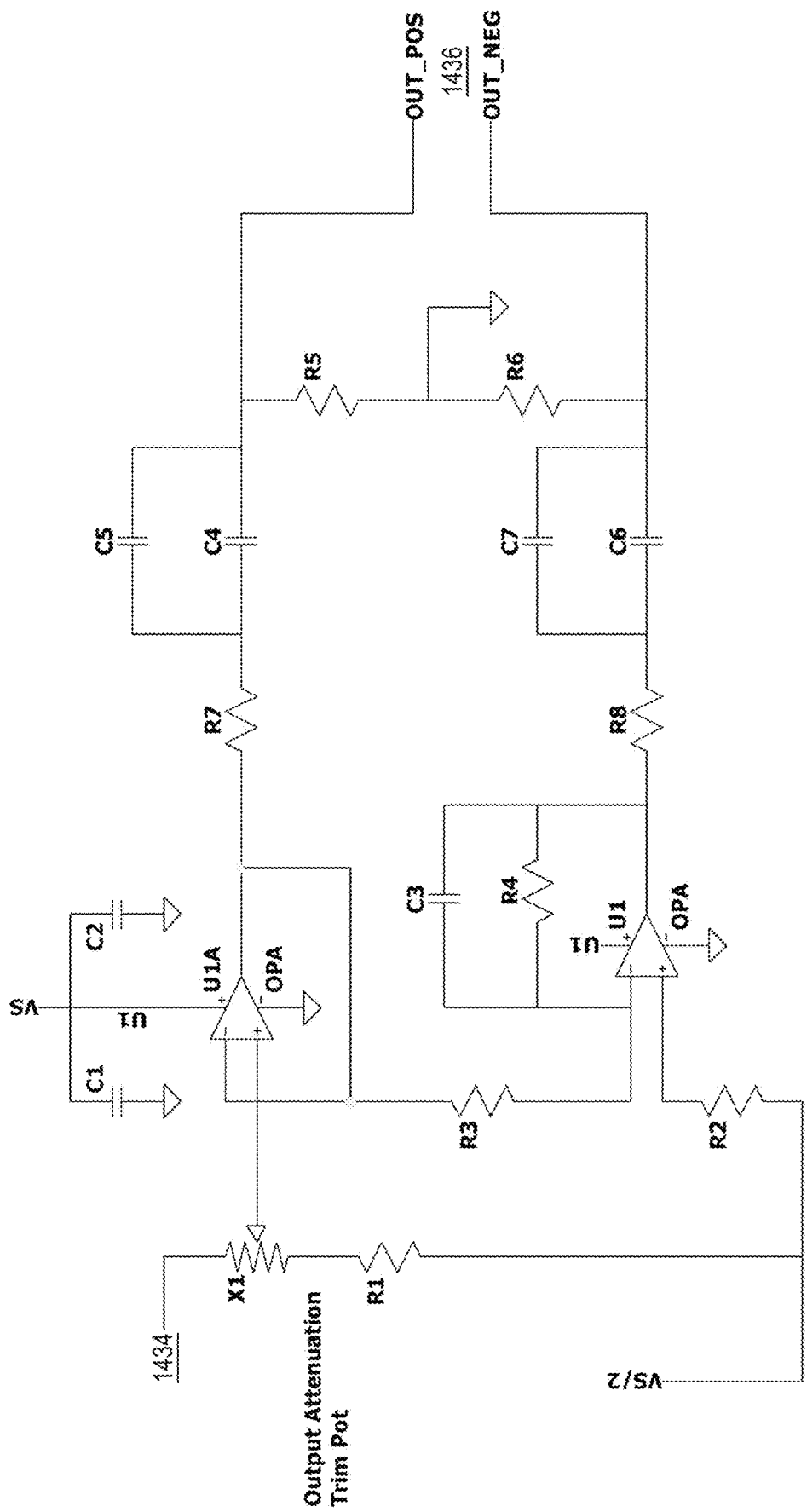
FIG. 24 is a circuit diagram illustrating an example of an audio output circuit described in connection with FIG. 14.

FIG. 24 is a circuit diagram illustrating an example implementation of the audio output circuit 1412. In one or more example implementations, the circuit components for the example of FIG. 24 may be specified as follows.

Figure 25:
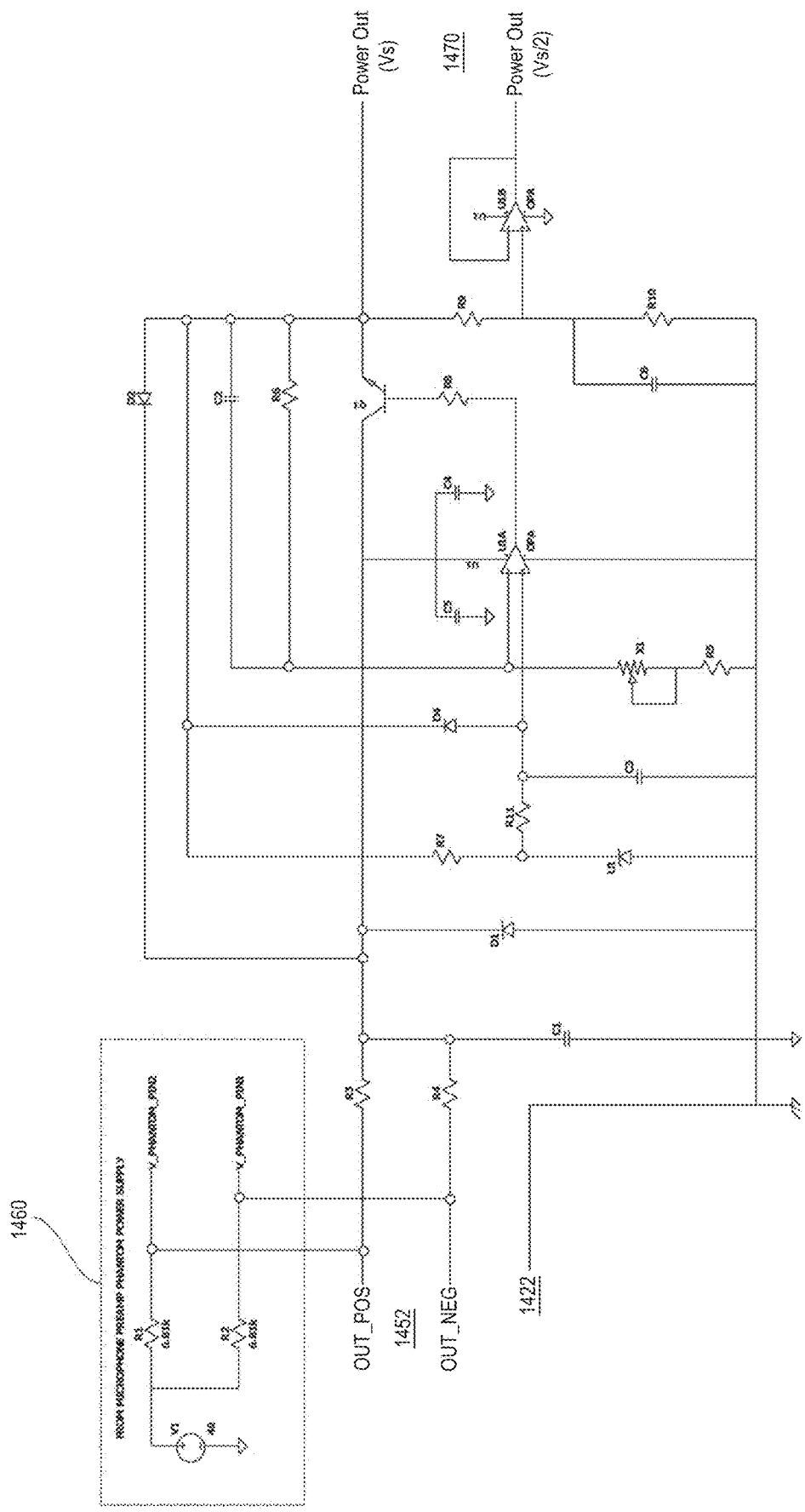
FIG. 25 is a circuit diagram illustrating an example of a power supply as described in connection with FIG. 14.

R1: 100 Ω
R2: 10 kΩ
R3: 10 kΩ
R4: 10 kΩ
R5: 100 kΩ
R6: 100 kΩ
R7: 100 Ω
R8: 100 Ω
Variable Resistor: 10 kΩ, Value=50
C1: 0.1 uF
C2: 1 uF
C3: 22 pF
C4: 100 uF
C5: 1 uF
C6: 100 uF
C7: 1 uF FIG. 25 is a circuit diagram illustrating an example of a power supply 1450 described in connection with FIG. 14. In one or more example implementations, the circuit components for the example of FIG. 25 may be specified as follows.

Figure 26:
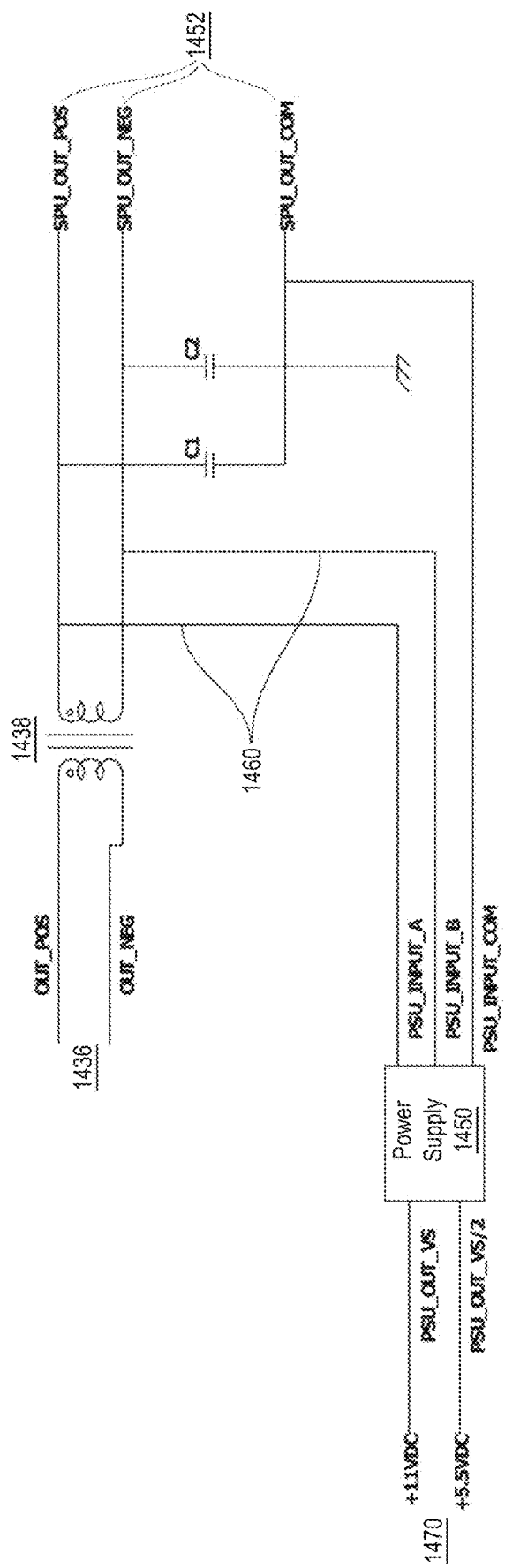
FIG. 26 is a circuit diagram illustrating examples of an audio output circuit and a transformer in relation to a power supply as described in connection with FIG. 14.

R1: 6.81 kΩ
R2: 6.81 kΩ
R3: 1 kΩ
R4: 1 kΩ
R5: 10 kΩ
R6: 15 kΩ
R7: 8.66 kΩ
R8: 100 Ω
R9: 150 kΩ
R10: 150 kΩ
Variable Resistor: 100 kΩ, value=55
C1: 1500 uF
C2: 4.7 uF
C3: 4.7 uF
C4: 1 uF
C5: 0.1 uF
C6: 1 uF FIG. 26 is a circuit diagram illustrating examples of audio output circuit 1412 and transformer 1438 in relation to power supply 1450 as described in connection with FIG. 14.

Figure 27:
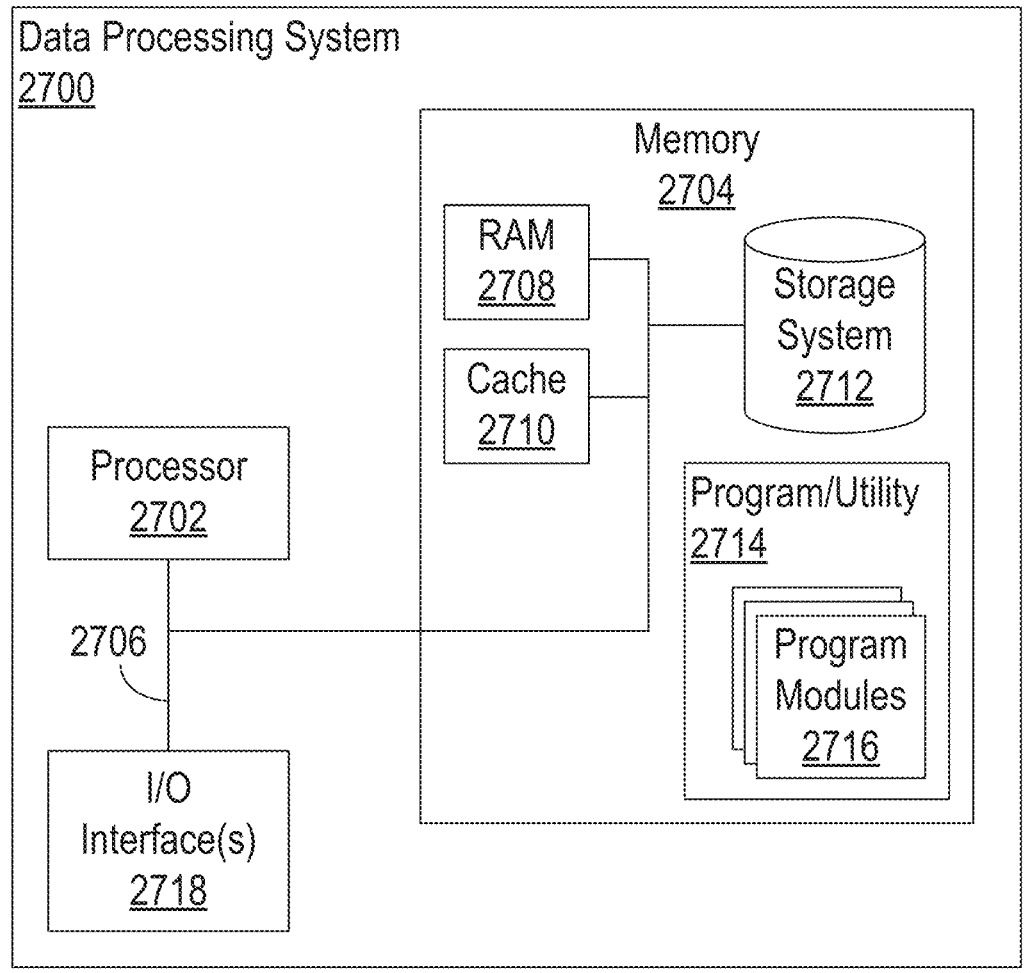
FIG. 27 illustrates another example implementation of selected components of the signal processing circuit described in connection with FIG. 14.

FIG. 27 illustrates another example implementation of selected components of signal processing circuit 104. In the example of FIG. 27, the various circuit blocks illustrated in FIG. 14 such as phase shift circuit 1404, channel mixer and attenuator circuit 1406, difference amplifier circuit 1408, and filter circuit 1410, may be implemented using program code executable by a processor such as a digital signal processor that may be included in a data processing system.

Accordingly, FIG. 27 illustrates an example of other circuitry embodied as a data processing system that may be used to implement the phase shift circuit 1404, channel mixer and attenuator circuit 1406, difference amplifier circuit 1408, and filter circuit 1410 of the signal processing circuit 104 as executable program code (e.g., software) executed using suitable hardware. Like the example implementation of FIG. 14, the example of FIG. 27 is capable of performing the operations described in connection with FIG. 14 in real time. As defined herein, "data processing system" means one or more hardware systems configured to process data, each hardware system including at least one processor programmed to initiate operations and memory.

The components of data processing system 2700 can include, but are not limited to, a processor 2702, a memory 2704, and a bus 2706 that couples various system components including memory 2704 to processor 2702. Processor 2702 may be implemented as one or more processors capable of carrying out instructions contained in program code. The circuit may be an integrated circuit or embedded in an integrated circuit. Processor 2702 may be implemented using a complex instruction set computer architecture (CISC), a reduced instruction set computer architecture (RISC), a vector processing architecture, a Digital Signal Processor, a Graphics Processing Unit, a programmable integrated circuit (e.g., a Field Programmable Gate Array), System-on-Chip, Central Processing Unit (CPU), or other known architectures. Example processors include, but are not limited to, processors having an x86 type of architecture (IA-32, IA-64, etc.), Power Architecture, ARM processors, and the like.

Bus 2706 represents one or more of any of a variety of communication bus structures. By way of example, and not limitation, bus 2706 may be implemented as a Peripheral Component Interconnect Express (PCIe) bus. Data processing system 2700 typically includes a variety of computer system readable media. Such media may include computer-readable volatile and non-volatile media and computer-readable removable and non-removable media.

Memory 2704 can include computer-readable media in the form of volatile memory, such as random-access memory (RAM) 2708 and/or cache memory 2710. Data processing system 2700 also can include other removable/non-removable, volatile/non-volatile computer storage media. By way of example, storage system 2712 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 2706 by one or more data media interfaces. Memory 2704 is an example of at least one computer program product.

Program/utility 2714, having a set (at least one) of program modules 2716, may be stored in memory 2704. Program/utility 2714 is executable by processor 2702. By way of example, program modules 2716 may represent an operating system (optional), one or more application programs, other program modules, and program data. Program modules 2716, upon execution, cause data processing system 2700, e.g., processor 2702, to carry out the functions and/or methodologies of the example implementations described within this disclosure. For example, one or more program modules 2716, when executed, may implement the various operations of signal processing circuit 104 as described herein.

Program/utility 2714 and any data items used, generated, and/or operated upon by data processing system 2700 are functional data structures that impart functionality when employed by data processing system 2700. As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

Data processing system 2700 may include one or more Input/Output (I/O) interfaces 2718 communicatively linked to bus 2706. I/O interface(s) 2718 allow data processing system 2700 to communicate with one or more external devices and/or communicate over one or more networks such as a local area network (LAN), a wide area network (WAN), and/or a public network (e.g., the Internet). Examples of I/O interfaces 2718 may include, but are not limited to, network cards, modems, network adapters, hardware controllers, etc. Examples of external devices also may include devices that allow a user to interact with data processing system 2700 (e.g., a display, a keyboard, and/or a pointing device) and/or other devices such as accelerator card.

In another example implementation, I/O interfaces 2718 may include an analog-to-digital converter (ADC) configured to generate digitized data, e.g., samples, from analog signals received from preamplifier circuit 1402. I/O interfaces 2718 may also include a digital-to-analog converter (DAC) configured convert digital data, e.g., samples, into analog signals that may be provided to one or more other systems such as audio output circuit 1412. It should be appreciated that in one or more other example implementations, data processing system 2700 may output digital data, e.g., samples, subsequent to the processing described with reference to FIG. 14 to one or more other compatible (e.g., digital) sound processing devices or systems.

Data processing system 2700 is only one example implementation. Data processing system 2700 can be practiced as a standalone device (e.g., as a computer), as a System-on-Chip, or other form factor. The example of FIG. 27 is not intended to suggest any limitation as to the scope of use or functionality of example implementations described herein. Data processing system 2700 is an example of computer hardware that is capable of performing the various operations described within this disclosure. In this regard, data processing system 2700 may include fewer components than shown or additional components not illustrated in FIG. 27 depending upon the particular type of device and/or system that is implemented.

FIG. 28 illustrates an example method 2800 for a sound capture system in accordance with the inventive arrangements described herein. Method 2800 may begin in block 2802 where a sound capture device configured for placement within a sound-generating device is provided. In block 2804, a suspension system configured to suspend the sound capture device within the sound-generating device is provided. The suspension system is capable of acoustically decoupling the sound capture device from the sound-generating device. The sound capture device can include a plurality of transducers configured to generate a plurality of audio signals concurrently from sound generated by the sound-generating device.

The foregoing and other implementations can each optionally include one or more of the following features, alone or in combination. Some example implementations include all the following features in combination.

The method can include providing a signal processing circuit configured to receive the plurality of audio signals and generate an output audio signal from the plurality of audio signals.

In another aspect, the signal processing circuit includes a processor programmed to initiate executable operations.

The method can include providing a diffusor within the sound-generating device.

The method can include installing the sound capture device within a musical instrument.

The installing retrofits the sound capture device to the musical instrument.

The method can include installing the sound capture device and the signal processing circuit within the musical instrument.

FIG. 29 illustrates an example method 2900 illustrating certain operative features of the inventive arrangements described herein. FIG. 29 illustrates certain operations implemented by sound capture system 100 including sound capture device 102 and signal processing circuit 104.

In block 2902, a first differential signal 1414, 1416 can be generated from a first transducer 804 disposed in a musical instrument 106. In block 2904, a second differential signal 1418, 1420 can be generated from a second transducer 804 disposed in the musical instrument 106. In block 2906, a first composite signal 1424 can be generated from the first differential signal. In block 2908, a second composite signal 1426 can be generated from the second differential signal. In block 2910, the first composite signal and the second composite signal can be signal processed using signal processing circuitry to generate an audio output signal 1452 by, at least in part, taking a difference between the first composite signal and the second composite signal (e.g., using difference amplifier circuit 1408).

The foregoing and other implementations can each optionally include one or more of the following features, alone or in combination. Some example implementations include all the following features in combination.

In another aspect, the signal processing can include filtering a difference signal 1432 generated by the taking a difference between the first composite signal and the second composite signal using one or more filter circuits.

In another aspect, the method can include providing power (regulated DC power output 1470) to one or more active components of signal processing circuit 104 configured to perform the signal processing, wherein the power is derived from phantom power source 1460.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "real time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

What is claimed is:

1. A system, comprising:
    a sound capture device configured for placement within a sound-generating device; and
    a suspension system configured to suspend the sound capture device within the sound-generating device;
    wherein the suspension system acoustically decouples the sound capture device from the sound-generating device; and
    wherein the sound capture device includes a plurality of transducers configured to generate a plurality of audio signals concurrently from sound generated by the sound-generating device; and
    a signal processing circuit configured to receive the plurality of audio signals and generate an output audio signal from the plurality of audio signals, wherein the signal processing circuit comprises:
        a preamplifier circuit configured to amplify a first audio signal of the plurality of audio signals generated by a first transducer of the plurality of transducers resulting in an amplified first audio signal and amplify a second audio signal of the plurality of audio signals generated by a second transducer of the plurality of transducers resulting in an amplified second audio signal; and
        a phase shift and attenuator circuit coupled to an output of the preamplifier circuit, wherein the phase shift and attenuator circuit is configured to generate a phase-shifted version of the amplified first audio signal by phase shifting a first frequency range of the amplified first audio signal by approximately 180 degrees;
        wherein the phase shift and attenuator circuit is configured to modify a level of at least one of the amplified first audio signal or the amplified second audio signal so that the amplified first audio signal, as phase-shifted, and the amplified second audio signal have substantially same levels.

2. The system of claim 1, wherein the sound-generating device is a musical instrument.

3. The system of claim 2, wherein the musical instrument is a percussion instrument.

4. The system of claim 2, wherein the sound capture device is moveably suspended within the sound-generating device in at least one of a direction parallel to a plane of a stretched membrane of the musical instrument or in a direction that is perpendicular to the plane of the stretched membrane.

5. The system of claim 1, wherein the sound capture device and the suspension system are configured to retrofit within the sound-generating device.

6. The system of claim 1, wherein the suspension system suspends the sound capture device within the sound-generating device so as to avoid physical contact of the sound capture device with an interior surface of the sound-generating device.

7. The system of claim 1, wherein the sound capture device is encompassed by radio frequency shielding.

8. The system of claim 1, wherein the sound capture device includes at least one of an inner dust protective layer or an outer dust protective layer.

9. The system of claim 1, wherein the suspension system includes an adjustable mounting system configured for retrofitting to existing hardware of the sound-generating device, wherein the hardware of the sound-generating device is located within the sound-generating device.

10. The system of claim 1, comprising:
a diffusor positioned below the sound capture device within the sound-generating device.

11. The system of claim 10, wherein the diffusor comprises:
a hollow body.

12. The system of claim 11, wherein the diffusor comprises:
a plurality of prongs extending out from the hollow body, wherein the plurality of prongs are configured to contact an inner surface of the sound-generating device to prevent the hollow body from contacting the inner surface of the sound-generating device.

13. The system of claim 1, wherein the first transducer and the second transducer are separated by a distance that is greater than or equal to a diameter of an interior diaphragm of the transducer.

14. The system of claim 1, wherein the first transducer and the second transducer are radio-frequency noise-canceling transducers.

15. The system of claim 1, wherein: the first transducer is a first humbucking microphone capsule; and the second transducer is a second humbucking microphone capsule.

16. The system of claim 1, wherein the first transducer and the second transducer are included in a transducer assembly that is suspended within the sound capture device.

17. The system of claim 1, wherein the first transducer and the second transducer are aligned along an axis forming an angle with a plane of a stretched membrane of the sound-generating device that is greater than 0° and less than 90°.

18. The system of claim 1, wherein the signal processing circuit includes a processor programmed to initiate executable operations.

19. The system of claim 1, wherein the signal processing circuit includes a power supply configured provide power to one or more active components of the signal processing circuit, wherein the power supply derives the power from a phantom power source coupled thereto.

20. A system, comprising:
a sound capture device configured for placement within a sound-generating device;
a suspension system configured to suspend the sound capture device within the sound-generating device;
wherein the suspension system acoustically decouples the sound capture device from the sound-generating device;
wherein the sound capture device includes a plurality of transducers configured to generate a plurality of audio signals concurrently from sound generated by the sound-generating device; and
a signal processing circuit configured to receive the plurality of audio signals and generate an output audio signal from the plurality of audio signals, wherein the signal processing circuit includes:
a preamplifier circuit configured to amplify a first audio signal of the plurality of audio signals generated by a first transducer of the plurality of transducers resulting in an amplified first audio signal and amplify a second audio signal of the plurality of audio signals generated by a second transducer of the plurality of transducers resulting in an amplified second audio signal; and
a phase shift and attenuator circuit coupled to an output of the preamplifier circuit, wherein the phase shift and attenuator circuit is configured to generate a phase-shifted version of the amplified first audio signal by phase shifting a first frequency range of the amplified first audio signal by approximately 180 degrees;
a difference amplifier circuit configured to sum the phase-shifted version of the amplified first audio signal and a version of the second audio signal as output from the phase shift and attenuator circuit; and
one or more filter circuits coupled to an output of the difference amplifier circuit, wherein the one or more filter circuits include a high-pass filter circuit configured to attenuate frequencies at or below approximately 60 Hz, a high-frequency boost filter circuit configured to increase frequencies between approximately 3 kHz and approximately 10 kHz, and a mid-frequency boost filter circuit configured to increase frequencies approximately within the first frequency range.

21. The system of claim 20, wherein the signal processing circuit comprises:
an output stage including a transformer configured to generate the output signal.

* * * * *